United States Patent
Mikawa et al.

(10) Patent No.: US 8,592,798 B2
(45) Date of Patent: Nov. 26, 2013

(54) NON-VOLATILE STORAGE DEVICE AND METHOD FOR MANUFACTURING THE SAME

(75) Inventors: Takumi Mikawa, Shiga (JP); Haruyuki Sorada, Okayama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/641,491

(22) PCT Filed: Apr. 21, 2011

(86) PCT No.: PCT/JP2011/002328
§ 371 (c)(1),
(2), (4) Date: Oct. 16, 2012

(87) PCT Pub. No.: WO2011/132423
PCT Pub. Date: Oct. 27, 2011

(65) Prior Publication Data
US 2013/0037777 A1 Feb. 14, 2013

(30) Foreign Application Priority Data
Apr. 21, 2010 (JP) ................................. 2010-097630

(51) Int. Cl.
*H01L 29/02* (2006.01)

(52) U.S. Cl.
USPC ..... 257/4; 257/2; 257/3; 257/5; 257/E29.002; 438/102; 438/103; 438/104

(58) Field of Classification Search
USPC .................. 257/1–5, E29.002; 438/102–104
See application file for complete search history.

(56) References Cited

U.S. PATENT DOCUMENTS

| 8,022,502 B2 | 9/2011 | Kanzawa et al. |
| 8,183,552 B2 | 5/2012 | Nakajima et al. |
| 8,242,478 B2 | 8/2012 | Sakamoto |
| 8,242,479 B2 | 8/2012 | Kawashima et al. |

(Continued)

FOREIGN PATENT DOCUMENTS

| JP | 2006-203098 | 8/2006 |
| JP | 2008-159760 | 7/2008 |

(Continued)

OTHER PUBLICATIONS

International Search Report issued Jul. 19, 2011 in International (PCT) Application No. PCT/JP2011/002328.

*Primary Examiner* — Jami M Valentine
(74) *Attorney, Agent, or Firm* — Wenderoth, Lind & Ponack, L.L.P.

(57) ABSTRACT

A variable resistance non-volatile storage device includes: a first line which includes a barrier metal layer and a main layer, and fills an inside of a line trench formed in a first interlayer insulating layer; a first electrode covering a top surface of the first line and comprising a precious metal; memory cell holes formed in a second interlayer insulating layer; a variable resistance layer formed in the memory cell holes and connected to the first electrode; and second lines covering the variable resistance layer and the memory cell holes, wherein in an area near the memory cell holes, the main layer is covered with the barrier metal layer and the first electrode in an arbitrary widthwise cross section of the first line.

9 Claims, 23 Drawing Sheets

(56) References Cited

U.S. PATENT DOCUMENTS

| | | |
|---|---|---|
| 2009/0052225 A1 | 2/2009 | Morimoto |
| 2009/0224224 A1 | 9/2009 | Fujii et al. |
| 2009/0230391 A1 | 9/2009 | Noshiro |
| 2009/0283736 A1 | 11/2009 | Kanzawa et al. |
| 2009/0309088 A1 | 12/2009 | Sakamoto |
| 2010/0032641 A1 | 2/2010 | Mikawa et al. |
| 2010/0038617 A1 | 2/2010 | Nakajima et al. |
| 2010/0188884 A1 | 7/2010 | Mitani et al. |
| 2010/0207094 A1 | 8/2010 | Kanzawa et al. |
| 2010/0264392 A1 | 10/2010 | Kawashima et al. |
| 2011/0002154 A1 | 1/2011 | Mitani et al. |
| 2011/0294259 A1 | 12/2011 | Kanzawa et al. |

FOREIGN PATENT DOCUMENTS

| | | |
|---|---|---|
| JP | 2008-244090 | 10/2008 |
| JP | 2009-218411 | 9/2009 |
| JP | 2010-021381 | 1/2010 |
| JP | 2010-067942 | 3/2010 |
| JP | 4427630 | 3/2010 |
| WO | 2008/001712 | 1/2008 |
| WO | 2008/059701 | 5/2008 |
| WO | 2008/062688 | 5/2008 |
| WO | 2008/149484 | 12/2008 |
| WO | 2009/050833 | 4/2009 |
| WO | 2009/050861 | 4/2009 |
| WO | 2009/063645 | 5/2009 |
| WO | 2009/136467 | 11/2009 |
| WO | 2010/004705 | 1/2010 |

(a)

(b)

(c)

(d)

(e)

(f)

(a)

(b)

(c)

(a)

(b)

(a)

(b)

(c)

(a)

(b)

(a)

(b)

NON-VOLATILE STORAGE DEVICE AND METHOD FOR MANUFACTURING THE SAME

TECHNICAL FIELD

The present invention relates to a non-volatile storage device which includes a variable resistance element having a resistance value which stably changes due to an application of a voltage pulse.

BACKGROUND ART

In recent years, the development of digital technology enables electronic devices such as portable information devices and information home appliances to have high functionality. Along with the expansion of functionality of such electronic devices, rapid progress is being made in miniaturizing semiconductor devices to be used and increasing the speed thereof. In particular, the usage of large-capacity non-volatile memory represented by a flash memory is being expanded rapidly. Furthermore, as a new, next-generation non-volatile memory which substitutes for the above flash memory, research and development are conducted on a non-volatile storage device in which a variable resistance element is used (which is referred to as a variable resistance non-volatile storage device or simply a non-volatile storage device). Here, a variable resistance element is an element which has a feature of reversibly changing its resistance value according to an electrical signal, and can furthermore store therein information corresponding to this resistance value in a non-volatile manner.

A crosspoint non-volatile memory element has been proposed, as an example of a large-capacity non-volatile memory which includes such a variable resistance element. An element having a configuration in which a variable resistance film is used as a storage unit and a diode element is used as a switching element is disclosed (see Patent Literature (PTL) 1, e.g.).

Parts (a) and (b) of FIG. 23 illustrate a non-volatile storage device 80 which includes conventional variable resistance elements. Part (a) of FIG. 23 is a perspective view of a crosspoint memory cell array 200 which includes bit lines 210, word lines 220, and memory cells 280 formed at crosspoints thereof. Part (b) of FIG. 23 is a cross-sectional view of the memory cell 280, the bit line 210, and the word line 220 in the bit line direction.

A variable resistance layer 230 which stores information according to a change in the electric resistance due to electrical stress is interposed between an upper electrode 240 and a lower electrode 250, thereby forming a variable resistance element 260. A nonlinear element 270 for bidirectional current flow is formed on the variable resistance element 260, and the memory cell 280 is formed by a series circuit having the variable resistance element 260 and the nonlinear element 270, the nonlinear element 270 having two terminals and nonlinear current-voltage characteristics. The nonlinear element 270 is a two-terminal element, such as a diode, having nonlinear current-voltage characteristics which show that a current change with respect to a voltage change is not constant.

In addition, the bit line 210 serving as an upper line is electrically connected to the nonlinear element 270, and the word line 220 serving as a lower line is electrically connected to the lower electrode 250 of the variable resistance element 260. A current flows through the nonlinear element 270 bidirectionally when the memory cell 280 is rewritten, and thus for example, a varistor having nonlinear current-voltage characteristics which are bidirectionally symmetrical (such as ZnO or $SrTiO_3$) is used therefor. The above configuration allows a current flow of 30 $kA/cm^2$ or more, which is current density necessary for rewriting the variable resistance element 260, and achieves large current density, thereby obtaining a large-capacity non-volatile memory.

CITATION LIST

Patent Literature

[PTL 1] Japanese Unexamined Patent Application Publication No. 2006-203098

SUMMARY OF INVENTION

Technical Problem

However, in the conventional configuration described above, the upper electrode 240, the variable resistance layer 230, the lower electrode 250, and the nonlinear element 270 are patterned in the direction along the bit line 210 at the same time when the bit line 210 is processed, and furthermore, are patterned in the direction along the word line 220 at the same time when the word line 220 is processed. Thus, the memory cell 280 is formed only at the position where the bit line and the word line cross by so-called double patterning.

According to this manufacturing method, the thickness of a film to be patterned is increased, and a pattern needs to be simultaneously formed on a plurality of element films comprising different materials, for instance. Thus, patterning by etching is difficult, and it cannot be said that this structure is suitable for miniaturization. In particular, if a precious metal represented by platinum (Pt) and iridium (Ir) and having a high standard electrode potential is used for either the upper electrode 240 or the lower electrode 250 so that favorable resistance change characteristics are achieved, or if copper (Cu) having a low line resistance is used for the bit line 210 and the word line 220, such materials are known as materials difficult to be etched, and thus it is extremely difficult to achieve both miniaturization and favorable device characteristics.

In addition, if Cu lines are used, a void is often formed in a Cu line since stress migration occurs in the Cu line due to the influence of a stress from an interline-layer insulating layer (not illustrated) formed in the layer above the Cu line. A Cu line in the vicinity of a memory cell hole is damaged by etching performed when the hole is formed, and thus stress migration resistance is decreased. Furthermore, linear and long lines of crosspoint memories constitute a layout with which the amount of change in stress is large and migration tends to locally occur, which is a concern. Generation of voids increases line resistance and also variations thereof, which leads to a fatal problem for a crosspoint memory device which is extremely sensitive to a change in the line resistance.

The present invention has been conceived in light of solving the above problems, and proposes a structure in which a variable resistance element is embedded inside a hole structure (memory cell hole) suitable for miniaturization. In other words, an object of the present invention is to provide a variable resistance non-volatile storage device whose resistance stably changes at a low voltage and which is suitable for miniaturization and a method for manufacturing the same.

Solution to Problem

In order to achieve the above object, a variable resistance non-volatile storage device of the present invention includes a substrate; a first interlayer insulating layer formed on the substrate; a first line which is formed in a line trench in the first interlayer insulating layer, and includes a barrier metal layer and a main layer, the barrier metal layer covering bottom and side surfaces of the line trench, and the main layer comprising a metal and filling an inside of the line trench; a first electrode comprising a precious metal, formed and covering the main layer and the barrier metal layer at a top surface of the first line; a second interlayer insulating layer formed above the substrate, on and above the first line, and on the first electrode; memory cell holes formed in the second interlayer insulating layer on the first electrode; a variable resistance layer formed in the memory cell holes and connected to the first electrode; and second lines each covering the variable resistance layer and one of the memory cell holes, and formed on the second interlayer insulating layer, wherein the first line includes, along a length of the first line, a portion in a first area which is an enclosed area along connected outer edges of the memory cell holes, and a portion in a second area other than the first area, the first electrode is formed across the memory cell holes, in an arbitrary widthwise cross section of the first line in the first area, the first electrode is in contact with the barrier metal layer of the first line, and the barrier metal layer and the first electrode cover the main layer of the first line, and the first line in the first area is not in direct contact with the second interlayer insulating layer.

Such a configuration allows a variable resistance element to be embedded in a hole structure suitable for miniaturization, thereby achieving a variable resistance non-volatile storage device suitable for large capacity and high integration. In addition, the first electrodes comprising a precious metal cover the first lines in the first area near the memory cells, thereby preventing the stress due to the interlayer insulation film from being directly applied, and increasing stress migration resistance.

Especially, in the arbitrary widthwise cross section of the first lines in the first area, the bottom and side surfaces of the main layer of each first line are completely covered with the barrier metal layer, and the top surface thereof is completely covered with the precious metal electrode. Thus, stress change due to the interlayer insulation film is absorbed by a material having a small thermal expansion coefficient, thereby further increasing stress migration resistance.

In particular, an extraction contact may be provided on the first line in the second area, and an extraction line may be formed connected to the extraction contact.

In addition, the variable resistance layer may include: a first variable resistance layer formed at least on a bottom of each of the memory cell holes, connected to the first electrode, and comprising a first transition metal oxide which has a first oxygen deficiency; and a second variable resistance layer formed in the memory cell holes and on the first variable resistance layer, and comprising a second transition metal oxide which is obtained from the same transition metal as a transition metal of the first variable resistance layer and has an oxygen deficiency higher than the first oxygen deficiency of the first variable resistance layer.

In addition, the first electrode may comprise a material having a standard electrode potential higher than a standard electrode potential of a transition metal which the variable resistance layer comprise.

The first variable resistance layer having a low oxygen deficiency is disposed on the bottom of the memory cell holes so as to be connected with the first electrodes, and the second variable resistance layer having a higher oxygen deficiency than that of the first variable resistance layer is disposed thereon. Furthermore, a material comprising a precious metal having a high standard electrode potential is used for the first electrodes. Consequently, the resistance can be reliably changed in the interfacial region of the first electrodes, a polarity at which a resistance changes can be always stabilized, and stable memory characteristics can be obtained. That is because oxidization and deoxidation near the electrode interface is dominant in the mechanism of resistance change operation, and the mechanism preferentially operates at the interface where much oxygen is present which can contribute to oxidization and deoxidization.

In addition, in the above variable resistance non-volatile storage device, preferably the first electrode includes an adhesion layer as a lower layer thereof. A precious metal material is less likely to interdiffuse with an interline-layer insulating film and cause reaction at the interface therebetween, and thus has little adhesion thereto and is easily detached therefrom. If the material is detached, a short circuit occurs between the first lines, which leads to a concern in a decrease in yield. It is possible to solve that problem by including the adhesion layer. In addition, the adhesion layer comprises Ti, Ta, titanium nitride, or tantalum nitride, and the material which is the same as that used for the above barrier metal layer is used therefor. Thus, the main layer of each first line is surrounded by the barrier metal layer and the adhesion layer which comprise the same type of material, and thus stress migration resistance can be further increased.

The above variable resistance non-volatile storage device may further include second electrodes provided on the variable resistance layer in the memory cell holes, and in contact with the variable resistance layer and the second lines.

Such a configuration allows a decrease in the thickness of the second variable resistance layer (thickness in the substrate thickness direction) by the thickness of the second electrodes embedded in the memory cell holes. Consequently, the electric fields in the first variable resistance layer and the second variable resistance layer are increased, thereby allowing operations at a low voltage.

The above-mentioned variable resistance non-volatile storage device may include a diode element provided between the second variable resistance layer and each of the second lines, and having a rectification effect. Such a configuration achieves a highly integratable variable resistance non-volatile storage device whose capacity can be increased without providing switching elements such as transistors.

A method for manufacturing a non-volatile storage device of the present invention includes forming a line trench in a first interlayer insulating layer on a substrate; forming a barrier metal layer which covers bottom and side surfaces of the line trench and the first interlayer insulating layer; forming a main layer which is in contact with the barrier metal layer, comprises a metal, and fills an inside of the line trench; removing the barrier metal layer and the main layer on the first interlayer insulating layer, and forming, in the line trench, a first line which includes the barrier metal layer and the main layer; forming a first electrode which comprises a precious metal and covers the main layer and the barrier metal layer at a top surface of the first line; forming a second interlayer insulating layer on the first interlayer insulating layer, on and above the first line, and on the first electrode; forming memory cell holes in the second interlayer insulating layer on the first electrode; forming, at least on a bottom of each of the memory cell holes, a first variable resistance layer comprising a transition metal oxide and connected to the first electrode; forming, in each of the memory cell holes and on the first variable resistance layer, a second variable resistance layer which comprises a transition metal oxide obtained from the same transition metal as a transition metal of the first variable resistance layer, and has an oxygen content lower than an oxygen content of the first variable resistance layer; and forming, on the second interlayer insulating layer, second lines each covering the second variable resistance layer and one of the memory cell holes, wherein when the first line includes, along a length of the first line, a portion in a first area which is an enclosed area along connected outer edges of the memory cell holes, and a portion in a second area other than the first area, in the formation of the first electrode, the first electrode is formed at least in the first area, the first electrode covering the barrier metal layer and the main layer.

Such a manufacturing method allows variable resistance elements to be embedded in a hole structure suitable for miniaturization, and thus enables manufacturing a variable resistance non-volatile storage device suitable for large capacity and high integration. The first electrodes comprising a precious metal are formed in a linear shape which has a certain area for maintaining adhesion and for which size reduction is the easiest, and are fine-processed by etching. Consequently, fine processing methods suitable for the first lines and the first electrodes are utilized therefor.

In the above method for manufacturing the variable resistance non-volatile storage device, the process of forming the first lines preferably includes: a process of forming the barrier metal layer on the entire surface which includes the bottom and side surfaces of each trench; a process of forming, in each line trench, the main layer which comprises copper and is in contact with the barrier metal layer; and a process of removing the barrier metal layer and copper on the first interlayer insulating layer, and forming, in each trench, the barrier metal layer and the main layer which comprises copper. This is because a Cu line which is the main layer of the first line is formed by a damascene process rather than etching, and thus the first lines can be reduced in size since the limit in size reduction depends on the width of the trenches in the insulating layer, which enables fine processing with ease.

A method for manufacturing a non-volatile storage device of the present invention includes forming a line trench in a first interlayer insulating layer on a substrate; forming a barrier metal layer which covers bottom and side surfaces of the line trench and the first interlayer insulating layer; forming a main layer which is in contact with the barrier metal layer, comprises a metal, and fills an inside of the line trench; removing the main layer on the first interlayer insulating layer, and forming, in the line trench, a first line which includes the barrier metal layer and the main layer while the barrier metal layer is left on a surface of the first interlayer insulating layer; removing, after forming a first electrode which comprises a precious metal and at least covers the main layer and the barrier metal layer at a top surface of the first line, an area which is included in the barrier metal layer on the surface of the first interlayer insulating layer and not covered with the first electrode; forming a second interlayer insulating layer on the first interlayer insulating layer, on and above the first line, and on the first electrode; forming memory cell holes in the second interlayer insulating layer on the first electrode; forming, at least on a bottom of each of the memory cell holes, a first variable resistance layer comprising a transition metal oxide and connected to the first electrode; forming, in each of the memory cell holes and on the first variable resistance layer, a second variable resistance layer which comprises a transition metal oxide obtained from the same transition metal as a transition metal of the first variable resistance layer, and has an oxygen content lower than an oxygen content of the first variable resistance layer; and forming, on the second interlayer insulating layer, second lines each covering the second variable resistance layer and one of the memory cell holes, wherein when the first line includes, along a length of the first line, a portion in a first area which is an enclosed area along connected outer edges of the memory cell holes, and a portion in a second area other than the first area, in the formation of the first electrode, the first electrode is formed at least in the first area, the first electrode covering the barrier metal layer and the main layer.

Such a manufacturing method further achieves the following effects, in addition to the same effects as described above. Specifically, the end surfaces of the first electrodes and the first lines are formed in a single process such that the end surfaces of the barrier metal layer of each of the first lines and the end surfaces of each of the first electrodes which appear in the widthwise cross section of the first lines in the first area are on the same planes. Accordingly, the area in which each barrier metal layer and each first electrode are adhered is increased, and the adhesion between the barrier metal layer and the first electrodes improves, which allows the main layer of the first lines to be more firmly protected from stress migration.

Advantageous Effects of Invention

The non-volatile storage device of the present invention can increase stress migration resistance by the first electrodes which comprise a precious metal covering the first lines near the memory cells so that the stress due to the interlayer insulation film is not directly applied. In addition, the non-volatile storage device can be formed without performing a patterning process by dry etching after the variable resistance layer is deposited. Thus, the variable resistance layer can be formed while etching is theoretically avoided which causes concern such as a reaction with etching gas, a damage due to oxygen reduction, and a damage due to charging. In addition, even when the memory cell holes are formed by etching, the main layer of the first lines is covered with the first electrodes which comprise a precious metal, and thus the main layer is not exposed to plasma damage. Thus, the present invention can provide a variable resistance non-volatile storage device whose resistances stably changes and which is suitable for miniaturization, and a method for manufacturing the same.

In particular, the first variable resistance layer having a low oxygen deficiency and connected to the first electrode which comprises a precious metal having a high standard electrode potential is disposed on the bottom of each memory cell hole, and the second variable resistance layer having a higher oxygen deficiency than the first variable resistance layer is disposed thereon, thus allowing a reliable resistance change in the interfacial region of the first electrodes, and achieving stable memory characteristics.

Furthermore, the second electrodes of the variable resistance elements are used for the electrodes of diode elements serving as switching elements, thereby also allowing diode elements to be embedded in the upper part of the memory cell holes, in addition to the variable resistance elements disposed on the bottom of the memory cell holes. This achieves effects of obtaining a variable resistance non-volatile storage device suitable for large capacity and high integration.

BRIEF DESCRIPTION OF DRAWINGS

FIG. 1 is a plan view illustrating an example of a configuration of a non-volatile storage device according to Embodiments 1, 2, 3, 4, 5, and 6 of the present invention.

FIG. 19 is an important part cross-sectional view of a non-volatile storage device according to Embodiment 6 of the present invention.

DESCRIPTION OF EMBODIMENTS

Figure 1:
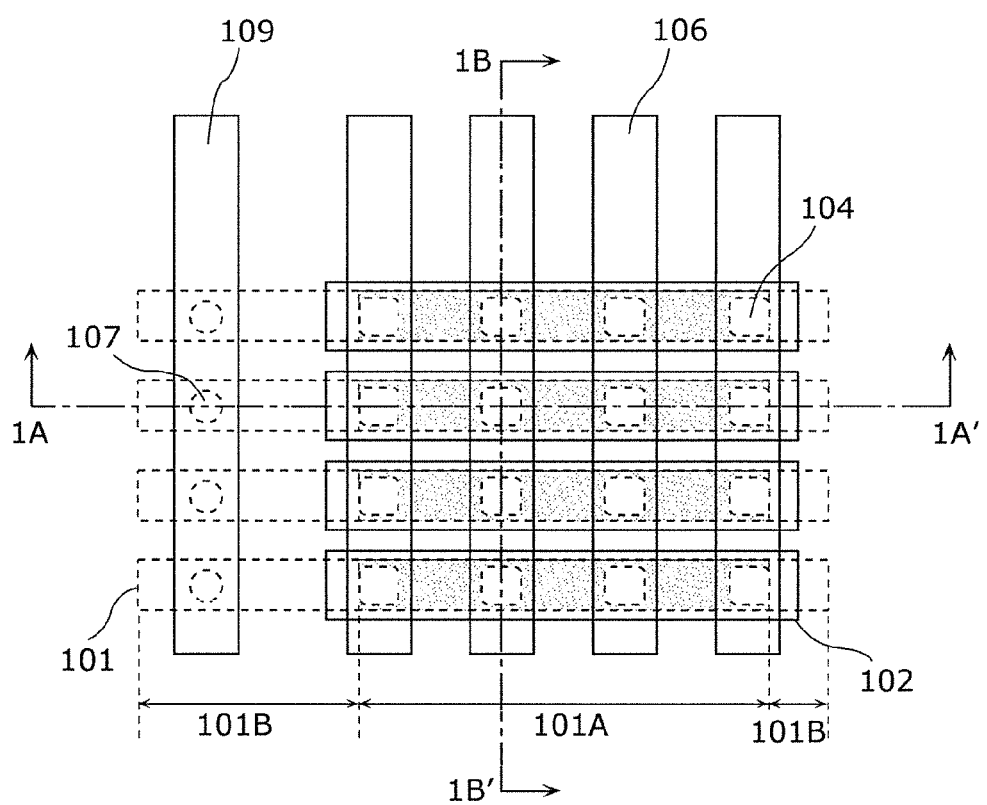
[FIG. 1]

The following is a description of a non-volatile storage device according to embodiments of the present invention and a method for manufacturing the same with reference to the drawings. It should be noted that a description of an element having the same numeral in the drawings may be omitted. In addition, the drawings schematically show constituent elements to facilitate understanding thereof, and thus the shape thereof and others are not accurately shown.

Embodiment 1

Configuration of Variable Resistance Non-Volatile Storage Device

FIG. 1 is a plan view illustrating an example of a configuration of a non-volatile storage device 10 according to Embodiment 1 of the present invention (non-volatile storage devices 20, 30, 40, 50, and 60 described below also have the same configuration in the plan view). Part (a) of FIG. 2 is a cross-sectional view showing a dashed-line portion indicated by 1A-1A' and viewed in the arrow direction in FIG. 1, and (b) of FIG. 2 is a cross-sectional view showing a dashed-line portion indicated by 1B-1B' and viewed in the arrow direction in FIG. 1.

Figure 2:
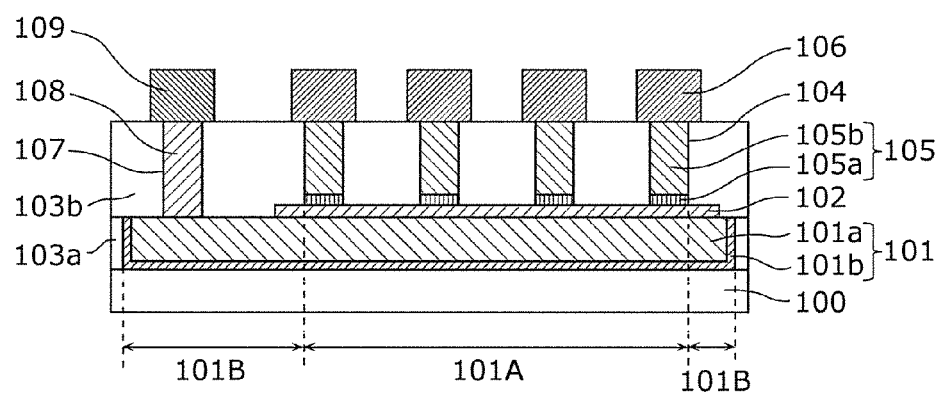
[FIG. 2] Parts (a) and (b) of FIG. 2 are important part cross-sectional views of the non-volatile storage device taken along 1A-1A' and 1B-1B' in FIG. 1 according to Embodiment 1 of the present invention.
Figure 2:
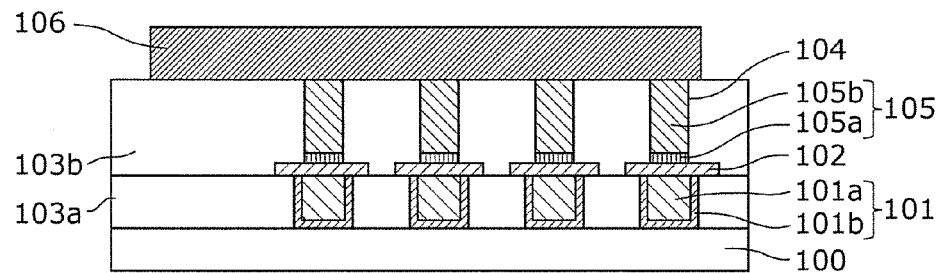

As illustrated in FIGS. 1 and 2, first lines 101 and second lines 106 each have a linear shape, and cross each other via a second interlayer insulating layer 103b. Memory cell holes 104 are formed, at the positions where the lines cross, through the second interlayer insulating layer 103b, and a variable resistance element is formed in each of the memory cell holes 104. A diode element may be formed in each of the memory cell holes 104 as well as the variable resistance element.

In addition, the first lines 101 are connected to an extraction line 109 via electric conduction plugs 108 provided in contact holes 107. The above configuration forms a cross-point memory array.

Here, as illustrated in FIG. 1, the first lines 101 are formed across the memory cell holes 104, and each include, along the length thereof, a portion in a first area 101A which includes an area in which a plurality of memory cell holes are present and an area near the memory cell holes, and a portion in a second area 101B other than the first area.

More specifically, the first area 101A is an enclosed area along connected outer edges of the memory cell holes 104 (shaded area in FIG. 1). Furthermore, first electrodes 102 are arranged so as to cover the first lines in the first area 101A.

As illustrated in (a) and (b) of FIG. 2, the non-volatile storage device 10 according to Embodiment 1 of the present invention includes a substrate 100 on which the first lines 101 are formed, a first interlayer insulating layer 103a formed between the first lines 101 on the substrate 100, the second interlayer insulating layer 103b formed on and above the first lines 101 and on the first interlayer insulating layer 103a, and the first electrodes (lower electrodes) 102 formed so as to cover the first lines 101 in the first area 101A.

The first lines 101 each include a main layer 101a comprising, for example, copper (Cu), and a barrier metal layer 101b formed around the main layer 101a (side and bottom surfaces thereof). Thus, the main part of the first lines 101 comprises copper. Here, the barrier metal layer 101b has a structure in which Ta (upper layer) and TaN (lower layer) are stacked.

Furthermore, the non-volatile storage device 10 includes the memory cell holes 104 which are formed through the second interlayer insulating layer 103b and reach the first electrodes 102, and the contact holes 107 which reach the first lines in the second area 101b. At the bottom of each of the memory cell holes 104, a first variable resistance layer 105a (having a thickness of 1 nm at least and 10 nm at most) is formed in contact with the first electrode 102, and a second variable resistance layer 105b is formed thereon. The memory cell holes 104 are filled with both layers. In addition, the contact holes 107 are each filled with the electric conduction plug 108 mainly comprising tungsten (W).

On the second interlayer insulating layer 103b, the second lines 106 are formed so as to cover the second variable resistance layer 105b formed in the memory cell holes 104, and the extraction line 109 is formed so as to be connected to the electric conduction plugs 108 formed in the contact holes 107. The second lines 106 may comprise copper (Cu), for example, and can be each caused to function as a second electrode (upper electrode) of a variable resistance element. Thus, a variable resistance element includes the first electrode 102, the first variable resistance layer 105a, the second variable resistance layer 105b, and the second line 106.

The first electrodes 102 are each formed so as to have a greater width than the width of the main layer 101a in the first area 101A, and such that the first electrodes 102 each cover the main layer 101a of the first line in the first area 101A, and are also in contact with the barrier metal layer 101b. With such a configuration, in any cross section across the width of the first line in the first area 101A, the first electrode 102 is in contact with the barrier metal layer 101b of the first line 101, and the barrier metal layer 101b and the first electrode 102 cover the outer sides of the main layer 101a of the first line. This achieves an effect of avoiding etching damage on the main layer 101a because the main layer 101a is not exposed when the first electrodes 102 are etched.

Here, the variable resistance layer 105 of the variable resistance elements comprises a transition metal oxide ($TaO_x$, where $0<x<2.5$) comprising an oxygen-deficient tantalum oxide, or a transition metal oxide ($HfO_x$, where $0<x<2.0$) comprising an oxygen-deficient hafnium oxide. An oxygen-deficient transition metal oxide is an oxide lower in oxygen content (atomic ratio: the ratio of the number of oxygen atoms to the total number of atoms) than an oxide having a stoichiometric composition. It is known that using such a variable resistance layer achieves a non-volatile memory element which has stable reversible rewriting characteristics and utilizes a resistance change phenomenon.

International Patent Application Publication No. 2008/059701 (PTL 2) and International Patent Application Publication No. 2008/149484 (PTL 3), for instance, describe in detail a non-volatile memory element having a variable resistance layer formed with a transition metal oxide (TaOx, where $0<x<2.5$) which comprises an oxygen-deficient tantalum oxide. In addition, International Patent Application Publication No. 2009/050861 (PTL 4) and International Patent Application Publication No. 2010/004705 (PTL 5) describe in detail a non-volatile memory element having a variable resistance layer formed with a transition metal oxide ($HfOx$, $0<x<2.0$) which comprises an oxygen-deficient hafnium oxide.

If an oxygen-deficient tantalum oxide is used, the oxygen content of the first variable resistance layer 105a is at least 68 atm % and at most 71 atm %, and the oxygen content of the second variable resistance layer 105b is at least 44 atm % and at most 66 atm %. This is because a design for having a high oxygen content in the vicinity of the first electrodes 102 allows a resistance change to easily occur due to oxidization and deoxidation at an electrode interface. Accordingly, it is possible to obtain favorable memory cell characteristics which enable driving at a low voltage.

The oxygen content can also be expressed as an oxygen deficiency. An oxygen deficiency means a proportion of deficient oxygen to the amount of oxygen which comprises an oxide in a stoichiometric composition of each transition metal. For example, if a transition metal is tantalum (Ta), a stoichiometric composition of its oxide is $Ta_2O_5$, and thus can be expressed as $TaO_{2.5}$. The oxygen deficiency of $TaO_{2.5}$ is 0%. For example, the oxygen deficiency of the oxygen-deficient tantalum oxide whose composition is $TaO_{1.5}$ is as follows. Oxygen deficiency=$(2.5-1.5)/2.5=40\%$ A transition metal other than tantalum or hafnium may be used as a metal which a transition metal oxide layer, namely, the variable resistance layer 105 comprises. As a transition metal, tantalum (Ta), titanium (Ti), hafnium (Hf), zirconium (Zr), niobium (Nb), tungsten (W), or the like can be used. The transition metal can be in a plurality of oxidation states, and thus different resistance states can be exhibited by oxidation-reduction reaction.

Furthermore, different materials may be used for the first transition metal which the first variable resistance layer 105a comprises and the second transition metal which the second variable resistance layer 105b comprises. In this case, it is preferable that the first variable resistance layer 105a comprises a material having a lower oxygen deficiency, or in other words, a higher resistance than the second variable resistance layer 105b. With such a configuration, a voltage applied between the first electrodes 102 and the second lines 106 when a resistance changes can be distributed more to the first transition metal oxide layer 105a, which allows the oxidation-reduction reaction in the first variable resistance layer 105a to be easily caused. In addition, when different materials are used for the first transition metal and the second transition metal, a standard electrode potential of the first transition metal is preferably lower than a standard electrode potential of the second transition metal. This is because a resistance change phenomenon is considered to occur due to an oxidation-reduction reaction induced in a minute conducting path (filament) formed in the first variable resistance layer 105a having a high resistance, so that the resistance value thereof is changed. For example, an oxygen-deficient tantalum oxide is used for the second variable resistance layer 105b, and $TiO_2$ is used for the first transition metal oxide layer 105a, thereby achieving stable resistance change operations. Titanium (standard electrode potential=$-1.63$ eV) is a material whose standard electrode potential is lower than that of tantalum (standard electrode potential=$-0.6$ eV). The standard electrode potential having a greater value represents a property of being more difficult to oxidize. Providing, as the first transition metal oxide layer 105a, metal oxide having a standard electrode potential lower than that of the second transition metal oxide layer 105b causes an oxidation-reduction reaction to easily occur in the first transition metal oxide layer 105a.

In addition, platinum (Pt), for instance, is used for the first electrodes 102 each serving as a lower electrode of the variable resistance element. Here, the standard electrode potential of platinum which indicates how easy oxidization and deoxidation is caused is V1=1.188 eV, the standard electrode potential of tantalum (Ta) is Vt=−0.6 eV, and the standard electrode potential of hafnium (Hf) is Vt=−1.55 eV. Thus, even if either tantalum oxide or hafnium oxide is used as the variable resistance layer, the relationship Vt<V1 is satisfied. According to such a standard electrode potential relationship, the oxidation-reduction reaction of the first variable resistance layer 105a occurs in the vicinity of the interface between the first variable resistance layer 105a and the first electrodes 102 comprising platinum, and oxygen ions are transferred between the first variable resistance layer 105a and the second variable resistance layer 105b, thereby causing a resistance change phenomenon to occur. This oxidation-reduction reaction preferentially occurs at the interface between the first variable resistance layer 105a and the first electrodes 102 comprising platinum. Specifically, the interface at which a resistance change phenomenon occurs can be fixed on the side where the electrodes comprising platinum are provided, and thus it is possible to prevent an incorrect operation of the electrodes on the opposite side due to the resistance change phenomenon.

Specifically, only one of the electrodes of each variable resistance element (here, the first electrode 102) comprises an electrode material having a standard electrode potential higher than a standard electrode potential of a transition metal which the variable resistance layer 105 comprises, whereas the other electrode comprises a material which has a standard electrode potential lower than the only one electrode (more preferably, an electrode material having a standard electrode potential lower than the standard electrode potential of the transition metal which the variable resistance layer 105 comprises). This configuration allows a stable resistance change by application of a voltage pulse for changing a resistance, even if the first variable resistance layer 105a is not previously formed (specifically, even if only the second variable resistance layer 105b is formed).

It should be noted that International Patent Application Publication No. 2009/050833 (PTL 6) and International Patent Application Publication No. 2009/136467 (PTL 7), for instance, describe in detail the occurrence of an oxidation-reduction reaction in a variable resistance layer in the vicinity of the interface between an electrode and the variable resistance layer, which induces a resistance change phenomenon, if a standard electrode potential (Vt) of a transition metal of a transition metal oxide which the variable resistance layer comprises and a standard electrode potential (V1) of a metal which the electrode comprises satisfy the relationship Vt<V1 described above.

In addition, iridium (Ir) or palladium (Pd) may be used as an electrode material for the first electrodes 102. The standard electrode potential of these electrode materials is 1.156 eV (Ir) and 0.951 eV (Pd), and is relatively high, compared with Ta (−0.6 eV) and Hf (−1.55 eV). Thus, Ir and Pd are preferable as the first electrode material which causes a resistance change in the vicinity of the interface.

Furthermore, the main layer 101a included in the first line is a Cu plated layer, and the barrier metal layer 101b has a stack structure including Ta (upper layer) and TaN (lower layer). However, the barrier metal layer 101b may be a layer comprising any material having a property of barrier to Cu. Although the first lines 101 can be reduced in size if the damascene process manufacturing method is used, a configuration such as conventional aluminum (Al) lines may be used.

Method for Manufacturing Variable Resistance Non-Volatile Apparatus

Figure 3:
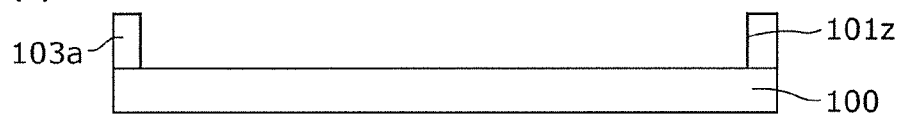
[FIG. 3] Parts (a) to (f) of FIG. 3 are cross-sectional views illustrating a method for manufacturing the non-volatile storage device and taken along 1A-1A' in FIG. 1 according to Embodiment 1 of the present invention.
Figure 3:
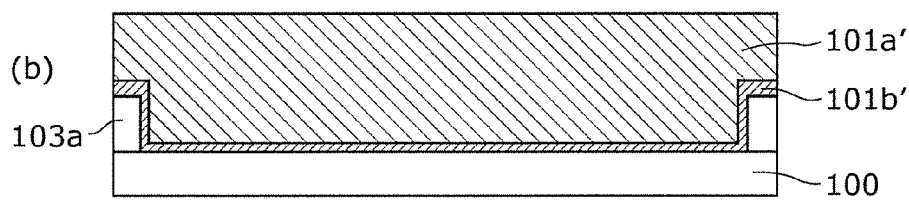
Figure 3:
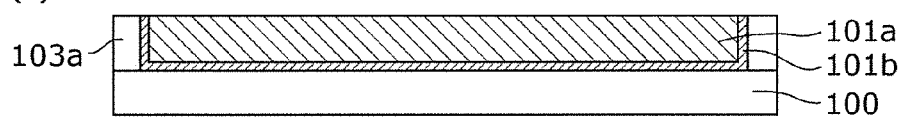
Figure 3:
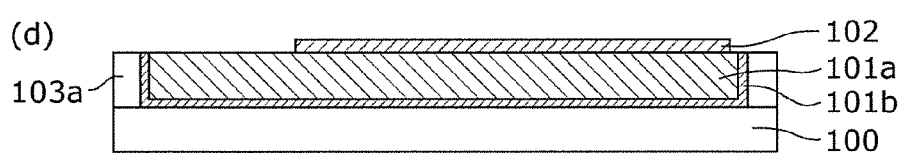
Figure 3:
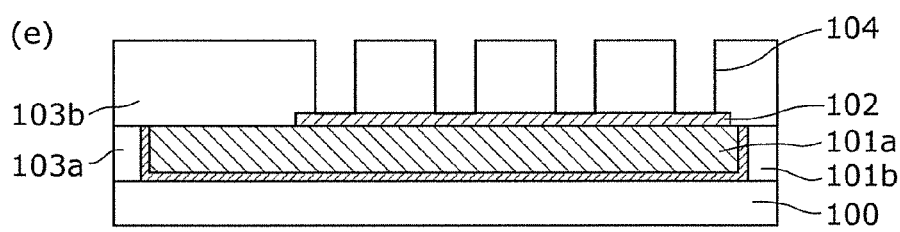
Figure 3:
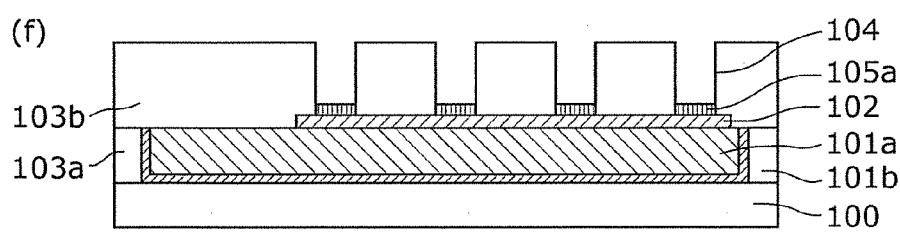
Figure 4:
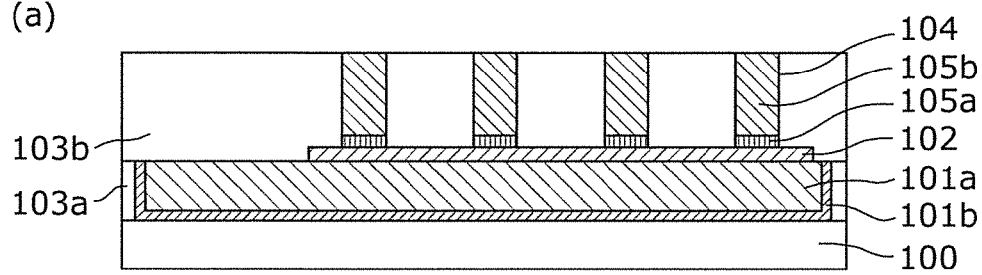
[FIG. 4] Parts (a) to (c) of FIG. 4 are cross-sectional views illustrating the method for manufacturing the non-volatile storage device and taken along 1A-1A' in FIG. 1 according to Embodiment 1 of the present invention.
Figure 4:
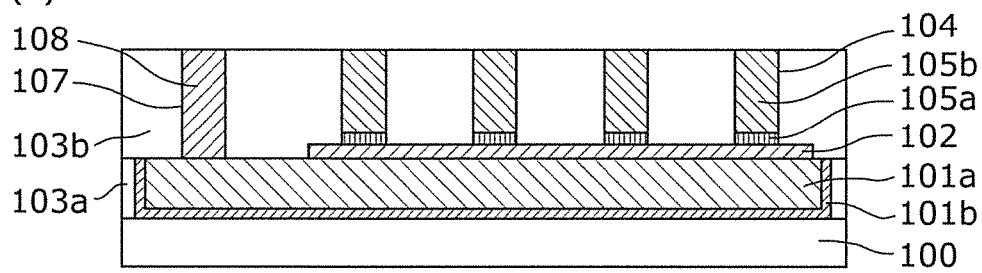
Figure 4:
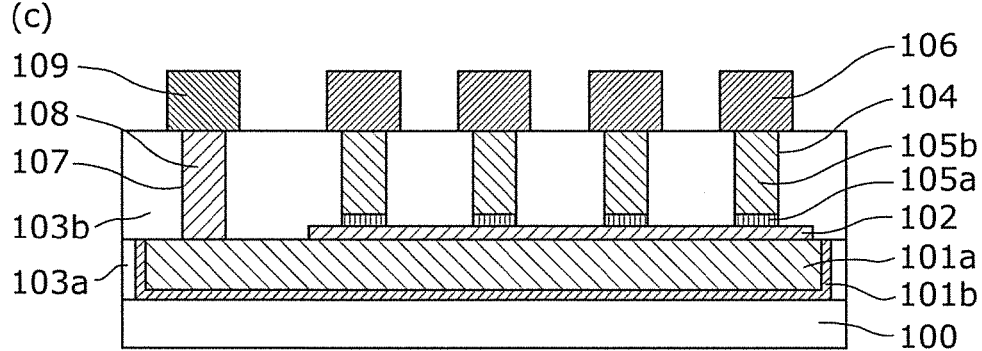
Figure 5:
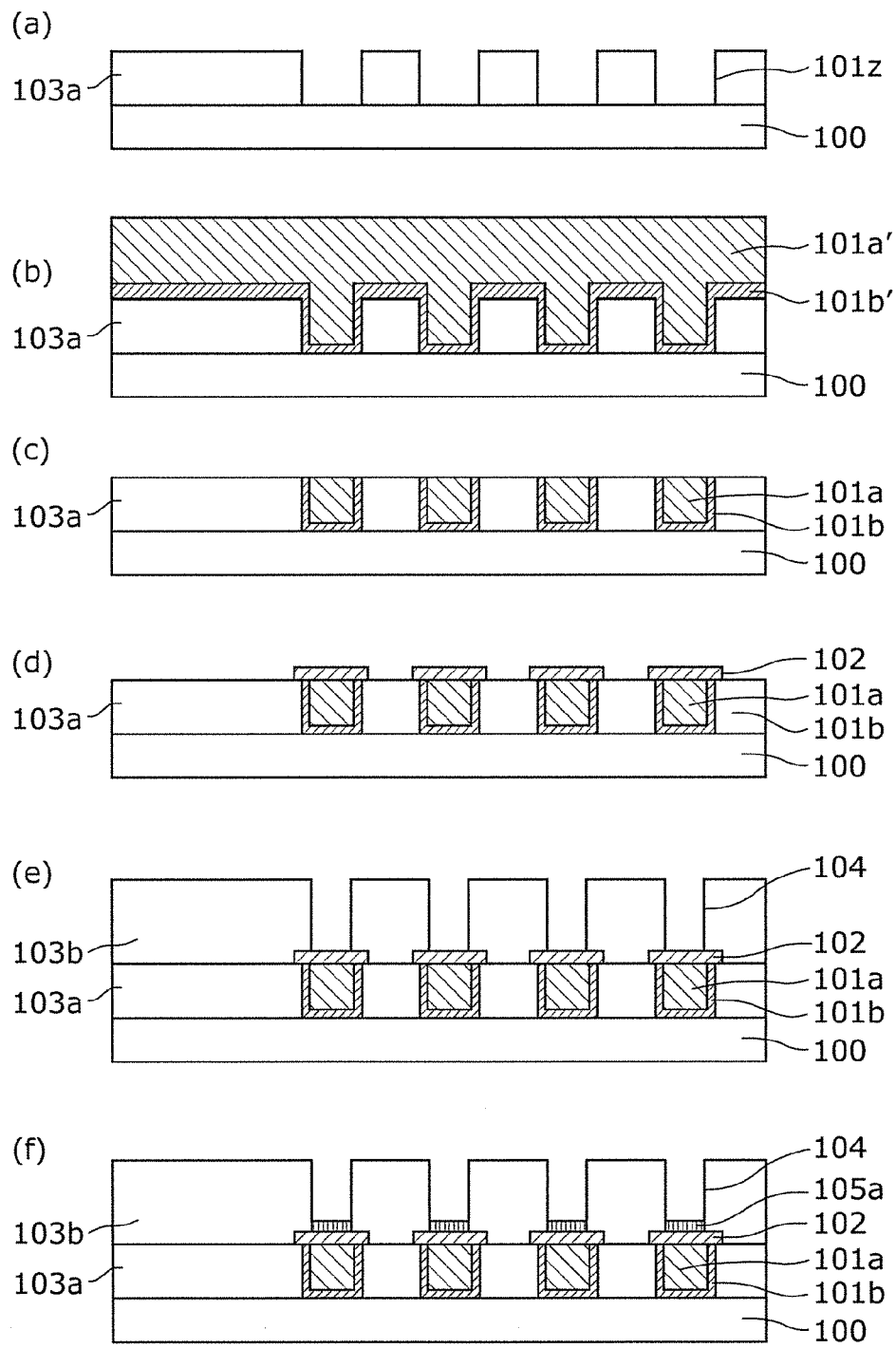
[FIG. 5] Parts (a) to (f) of FIG. 5 are cross-sectional views illustrating the method for manufacturing the non-volatile storage device and taken along 1B-1B' in FIG. 1, according to Embodiment 1 of the present invention.
Figure 6:
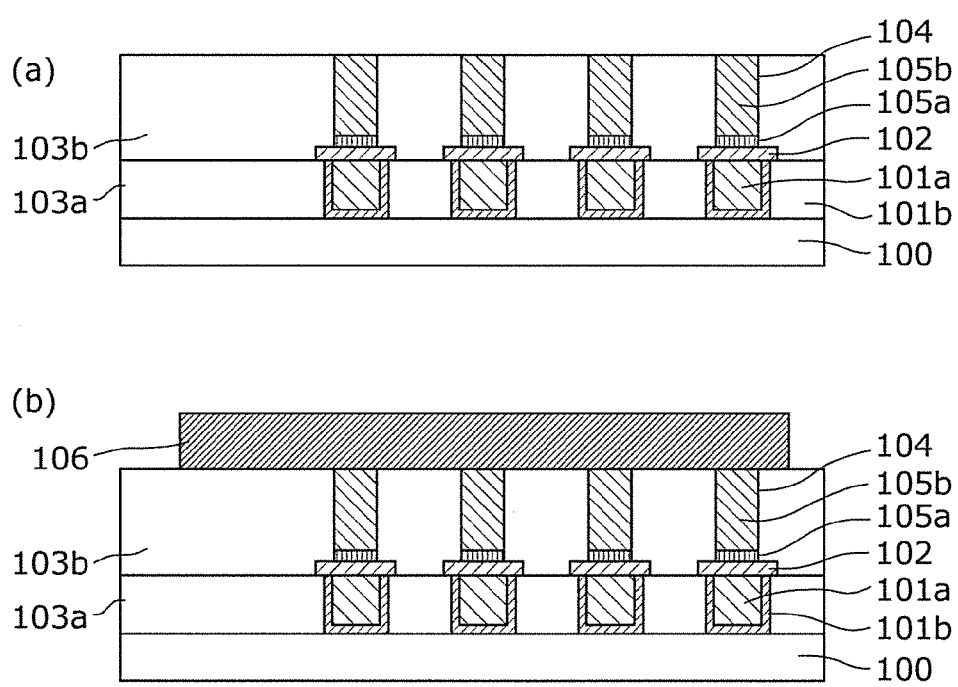
[FIG. 6] Parts (a) and (b) of FIG. 6 are cross-sectional views illustrating the method for manufacturing the non-volatile storage device and taken along 1B-1B' in FIG. 1 according to Embodiment 1 of the present invention.

Next is a description of a method for manufacturing a variable resistance non-volatile storage device according to Embodiment 1 of the present invention. FIGS. 3, 4, 5, and 6 are cross-sectional views illustrating the method for manufacturing the non-volatile storage device 10 according to Embodiment 1 of the present invention. FIGS. 3 and 4 are cross-sectional views showing the dashed-line portion indicated by 1A-1A' and viewed in the arrow direction in FIG. 1, whereas FIGS. 5 and 6 are cross-sectional views showing the dashed-line portion indicated by 1B-1B' and viewed in the arrow direction in FIG. 1. A description is given of the method for manufacturing the non-volatile storage device 10 according to Embodiment 1 of the present invention, with reference to these drawings.

As illustrated in (a) of FIG. 3 and (a) of FIG. 5, in the process of forming line trenches 101z, the first interlayer insulating layer 103a (having a thickness of 100 to 300 nm) which includes a silicon oxide film is formed on the substrate 100, and the line trenches 101z for embedding the first lines 101 later are patterned using a desired mask.

Next, as illustrated in (b) of FIG. 3 and (b) of FIG. 5, in the process of forming a plated layer 101a' comprising, for example, Cu in the line trenches 101z, first, a barrier metal layer 101b' (having, for example, a stack structure which includes an upper Ta layer and a lower TaN layer, which are not illustrated) is formed on the entire surface by sputtering. Furthermore, a Cu seed layer is formed by sputtering (not illustrated), and thereafter a Cu layer is formed by plating. At this time, the line trenches 101z are filled with the plated layer 101a' and the barrier metal layer 101b'.

Next, as illustrated in (c) of FIG. 3 and (c) of FIG. 5, in the process of forming the first lines 101, unnecessary Cu and the like on the first interlayer insulating layer 103a are removed by chemical mechanical polishing (CMP), and the first line which includes the main layer 101a and the barrier metal layer 101b is formed only in each of the first line trenches 101z. At this time, the bottom and side surfaces of the main layer 101a of the first lines are covered with the barrier metal layer 101b, whereas the top surface thereof is in the state where Cu is exposed.

Next, as illustrated in (d) of FIG. 3 and (d) of FIG. 5, in the process of forming the first electrodes 102, a platinum layer, for example, is formed by sputtering on the first lines 101 and the first interlayer insulating layer 103a, and thereafter the platinum layer is etched using a desired mask, and the first electrodes 102 comprising platinum are formed.

The first electrodes 102 are formed so as to cover the first lines in the first area 101A. This can prevent an etching damage caused when forming the memory cell holes 104 from being imposed on and oxygen from being included in the main layer 101a of the first lines 101.

In addition, the first electrodes 102 are each formed in a linear form across the memory cell holes 104 such that the memory cell holes 104 share the first electrode 102 (see FIG. 1). A photoresist pattern used when the platinum layer is patterned into the first electrodes 102 can be increased in size by adopting such a linear-shaped electrode, compared with a dot-shaped electrode formed for each of the memory cell holes, which secures the adhesion between the platinum layer and the photoresist with ease. Therefore, the minimum process size can be even reduced.

Next, as illustrated in (e) of FIG. 3 and (e) of FIG. 5, in the process of forming the memory cell holes 104, the second interlayer insulating layer 103b which includes a silicon oxide film is formed on the entire surface so as to cover the first electrodes 102, and the surface thereof is planarized. After that, the memory cell holes 104 connected to the first electrodes 102 through the second interlayer insulating layer 103b are formed.

Next, as illustrated in (f) of FIG. 3 and (f) of FIG. 5, in the process of forming the first variable resistance layer 105a, a metal layer (here, tantalum is used) is formed by electroless plating so as to selectively grow only on the first electrodes 102 exposed on the bottom of the memory cell holes 104. This transition metal is oxidized in oxygen environment (at least 400° C. and at most 450° C.), thereby forming the first variable resistance layer 105a which comprises a tantalum oxide. The first variable resistance layer 105a is completely oxidized, and thus the oxygen content is about 71 atm %, which is close to that of $Ta_2O_5$ which represents a tantalum oxide having a stoichiometric composition. In addition, here, thermal oxidation is used which is efficient in completely oxidizing a transition metal to obtain a transition metal oxide.

Next, as illustrated in (a) of FIG. 4 and (a) of FIG. 6, in the process of forming the second variable resistance layer 105b, the tantalum oxide of the second variable resistance layer 105b having a lower oxygen content than that of the first variable resistance layer 105a is formed by sputtering a tantalum target in an argon-oxygen atmosphere, or in other words, so-called reactive sputtering. The partial pressure of oxygen gas in the atmosphere is adjusted such that the oxygen content of the second variable resistance layer 105b is about 55 atm %. The second variable resistance layer 105b is formed by sputtering until the memory cell holes 104 are completely filled, and thereafter unnecessary tantalum oxide on the second interlayer insulating layer 103b is removed by CMP, thereby forming the second variable resistance layer 105b only in the memory cell holes 104.

With such a manufacturing method, the variable resistance layer 105 can be formed without performing, on the first variable resistance layer 105a on the bottom of the memory cell holes 104, an etching process which causes concerns when the second variable resistance layer 105b is formed, such as reaction with etching gas, damage due to oxygen reduction, and damage due to charge.

Next, as illustrated in (b) of FIG. 4, in the process of forming extraction contact, the contact hole 107 which reaches the first line 101 through the second interlayer insulating layer 103b is formed. Furthermore, an adhesion layer (the upper titanium nitride layer and the lower titanium layer, which are not illustrated) is formed on the entire surface of the contact hole by sputtering. Furthermore, tungsten is deposited by chemical vapor deposition (CVD), and unnecessary tungsten and the like on the second interlayer insulating layer 103b are removed by CMP, and thereby the electric conduction plug 108 which comprises tungsten and includes the adhesion layer, for example, is formed only inside the contact hole 107.

At last, as illustrated in (c) of FIG. 4 and (b) of FIG. 6, in the process of forming the second lines 106 and the extraction line 109, the second lines 106 which cover the second variable resistance layer 105b in the memory cell holes 104, and the extraction line 109 connected to the electric conduction plugs 108 in the contact holes 107 are patterned on the second interlayer insulating layer 103b, using a desired mask. The second lines 106 and the extraction line 109 comprise copper (Cu), for example.

According to the above manufacturing method according to Embodiment 1 of the present invention, a pattern process by dry etching is not used after the variable resistance layers are formed, and thus the variable resistance layers can be formed while theoretically avoiding etching which causes concerns such as a reaction with etching gas, a damage due to oxygen reduction, and a damage due to charge. In addition, even when the memory cell holes are formed by etching, the main layer (Cu) of the first lines is covered with the first electrodes which comprise a precious metal, and thus the main layer is not exposed to plasma damage. Thus, it is possible to provide a variable resistance non-volatile storage device whose resistance stably changes at a low voltage and which is suitable for miniaturization, and a method for manufacturing the same.

It should be noted that the second lines 106 and the extraction line 109, and the electric conduction plugs 108 may be formed by a single damascene process or a dual damascene process.

[Modification]

Figure 7:
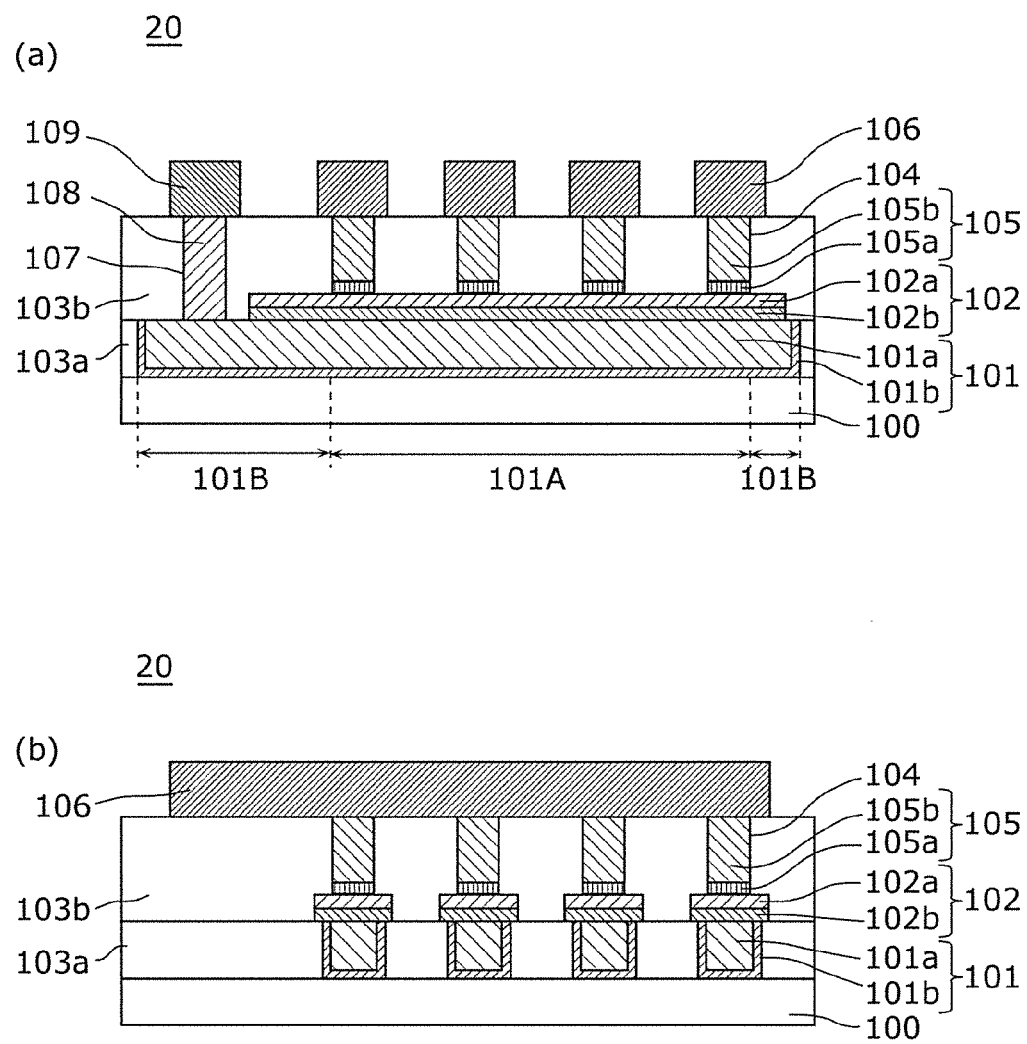
[FIG. 7] Parts (a) and (b) of FIG. 7 are important part cross-sectional views of a non-volatile storage device taken along 1A-1A' and 1B-1B' in FIG. 1 according to a modification of Embodiment 1 of the present invention.

Parts (a) and (b) of FIG. 7 are cross-sectional views illustrating an example of a configuration of a non-volatile storage device 20 according to a modification of Embodiment 1 of the present invention. Part (a) of FIG. 7 is a cross-sectional view showing the dashed-line portion indicated by 1A-1A' and viewed in the arrow direction in FIG. 1, and (b) of FIG. 7 is a cross-sectional view showing the dashed-line portion indicated by 1B-1B' and viewed in the arrow direction in FIG. 1.

The configuration of the non-volatile storage device 20 according to the present modification is different from the configuration of the non-volatile storage device 10 according to Embodiment 1 described above in that the first electrodes 102 which comprise a precious metal material such as Pt each have a structure in which an upper precious metal layer 102a and a lower adhesion layer 102b are stacked. A precious metal material is less likely to interdiffuse with an interlayer insulating layer material and cause reaction at the interface therebetween. Thus, such a precious metal material has little adhesion to the interlayer insulating layer material under the precious metal material, and has a property of being easily detached at the interface with the interlayer insulating layer thereunder at the point in time when the precious metal layer is formed on the entire surface. The occurrence of the detachment causes a short circuit between the first lines, which leads to a concern in a decrease in yield. The effect of solving such problems can be expected to be achieved by including the adhesion layer in each of the first electrodes 102.

Here, a stack structure having TaN (upper layer) and Ta (lower layer) is used as an adhesion layer. The adhesion layer 102b of the first electrodes 102 completely covers the main layer 101a of the first lines 101 in the first area 101A, and thus the effect of maintaining the adhesion to the first interlayer insulating layer 103a can be obtained.

Furthermore, by forming the adhesion layer 102b using the same material as that of the barrier metal layer 101b, it is possible to surround the main layer 101a with the same material, and equalize the stress imposed on the main layer 101a, thereby increasing stress migration resistance. It should be noted that the adhesion layer 102b on the first interlayer insulating layer 103a is removed together with the upper layer comprising a precious metal electrode material when patterning is performed to obtain the first electrodes 102, as illustrated in (b) of FIG. 7.

Embodiment 2

Configuration of Variable Resistance Non-Volatile Storage Device

Figure 8:
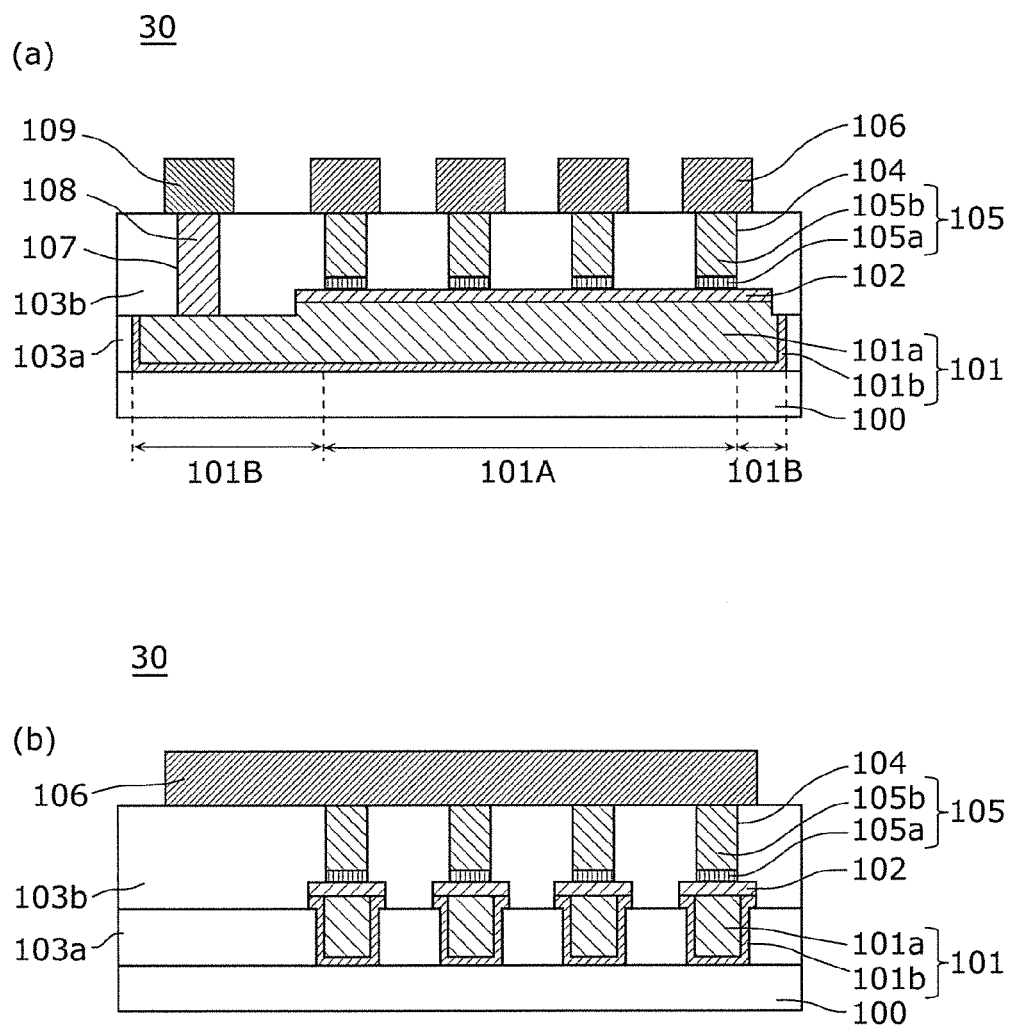
[FIG. 8] Parts (a) and (b) of FIG. 8 are important part cross-sectional views of a non-volatile storage device taken along 1A-1A' and 1B-1B' according to Embodiment 2 of the present invention.

Parts (a) and (b) of FIG. 8 are cross-sectional views illustrating an example of a configuration of a variable resistance non-volatile storage device 30 according to Embodiment 2 of the present invention. Part (a) of FIG. 8 is a cross-sectional view showing a dashed-line portion indicated by 1A-1A' and viewed in the arrow direction in FIG. 1, and (b) of FIG. 8 is a cross-sectional view showing a dashed-line portion indicated by 1B-1B' and viewed in the arrow direction in FIG. 1.

Here, the differences from the non-volatile storage device 10 according to Embodiment 1 are the two points below.

The first point is that each end surface of first electrodes 102 comprising a precious metal and each end surface of first lines 101 are on the same plane perpendicular to the cross section taken along line 1B-1B' (see (b) of FIG. 8). The end surfaces of the first electrodes 102 and the first lines 101 are formed in a single process such that each end surface of the barrier metal layer 101b of the first lines 101 is on the plane common to each end surface of the first electrodes 102, the end surfaces being perpendicular to the cross section taken along line 1B-1B'. This increases the area in which the barrier metal layer 101b and the first electrodes 102 are adhered to each other, and increases the adhesion between the barrier metal layer 101b and the first electrodes 102, thereby achieving stronger protection of a main layer 101a of the first lines 101 from stress migration.

The second point is that the first lines 101 are each formed extending even above a line trench. Specifically, the cross-sectional area of the main layer 101a portion of the first lines in the thickness direction is increased, and thus line resistance can be further decreased. In addition, if almost the same line resistance is to be maintained, a space between the lines can be decreased by that, and thus miniaturization is possible.

Method for Manufacturing Variable Resistance Non-Volatile Device

Figure 9:
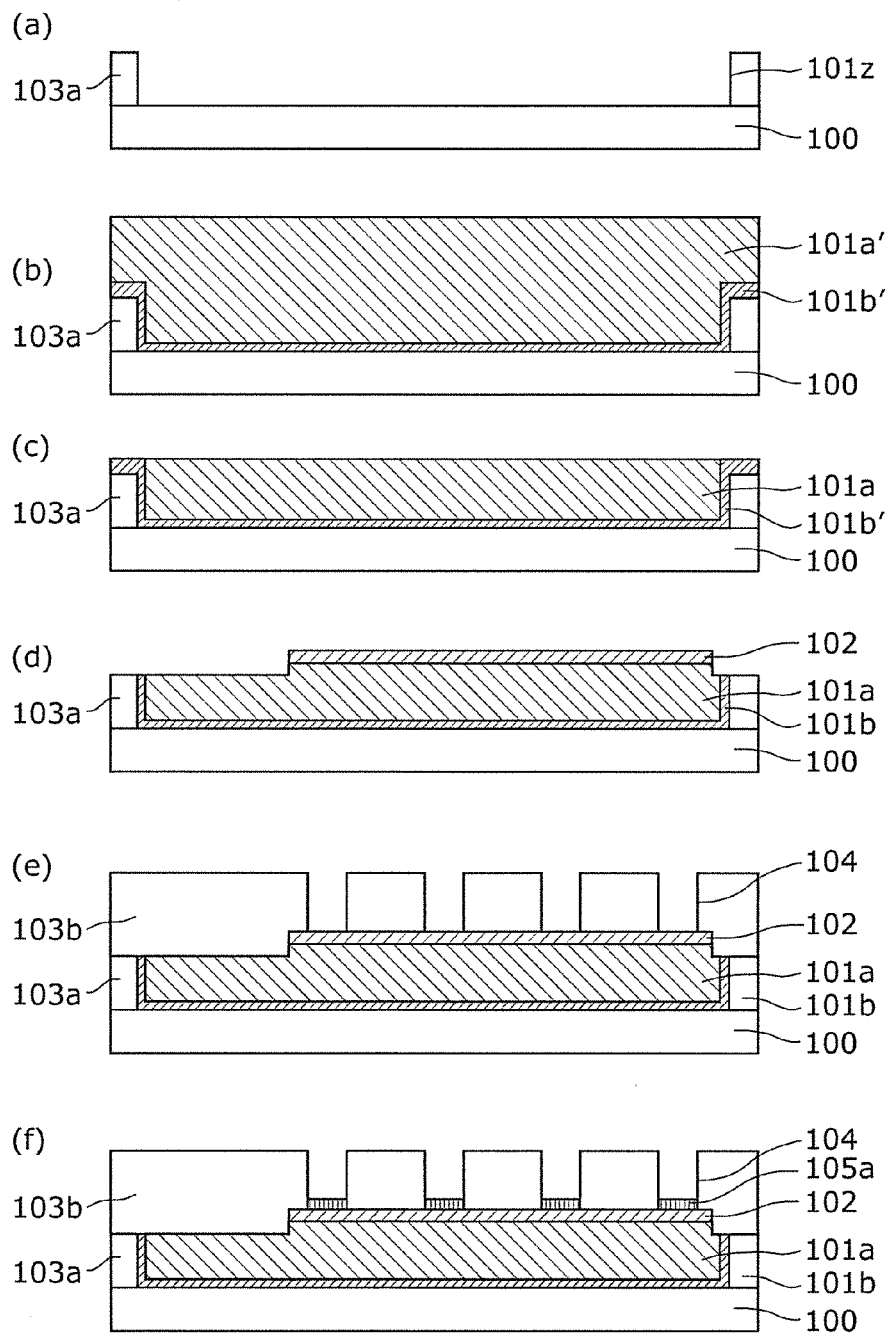
[FIG. 9] Parts (a) to (f) of FIG. 9 are cross-sectional views illustrating a method for manufacturing the non-volatile storage device and taken along 1A-1A' in FIG. 1 according to Embodiment 2 of the present invention.
Figure 10:
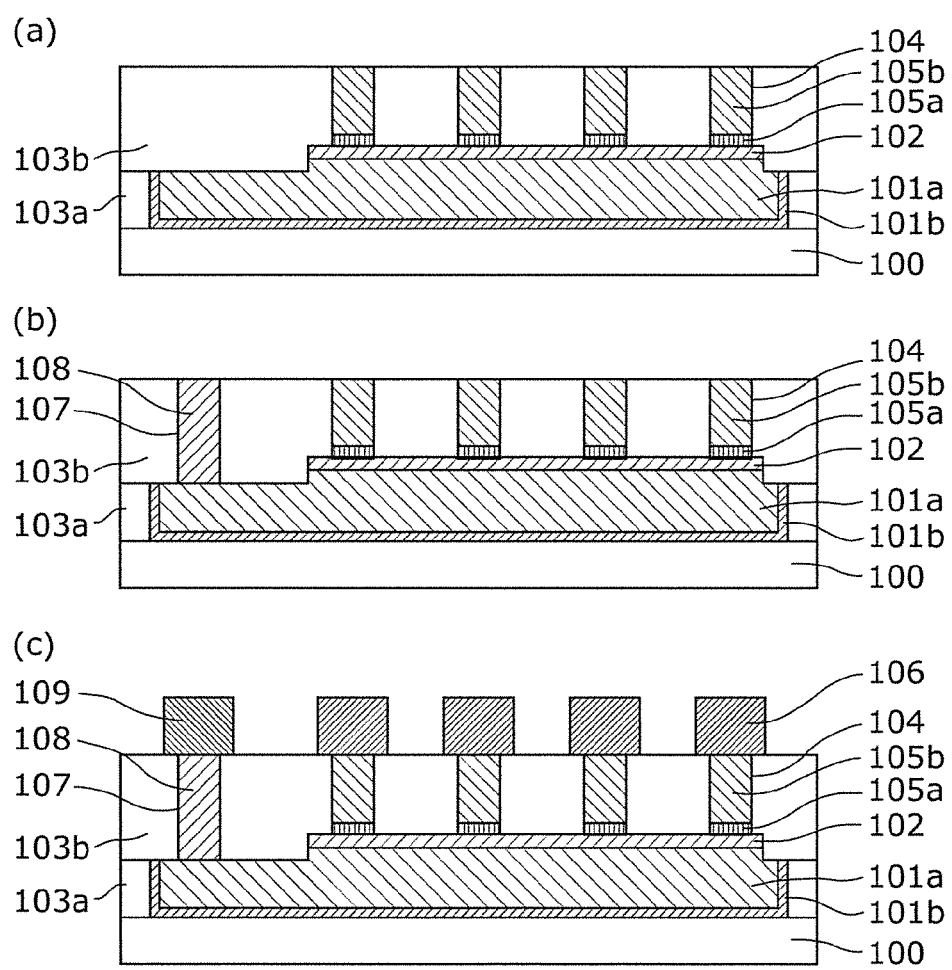
[FIG. 10] Parts (a) to (c) of FIG. 10 are cross-sectional views illustrating the method for manufacturing the non-volatile storage device and taken along 1A-1A' in FIG. 1 according to Embodiment 2 of the present invention.
Figure 11:
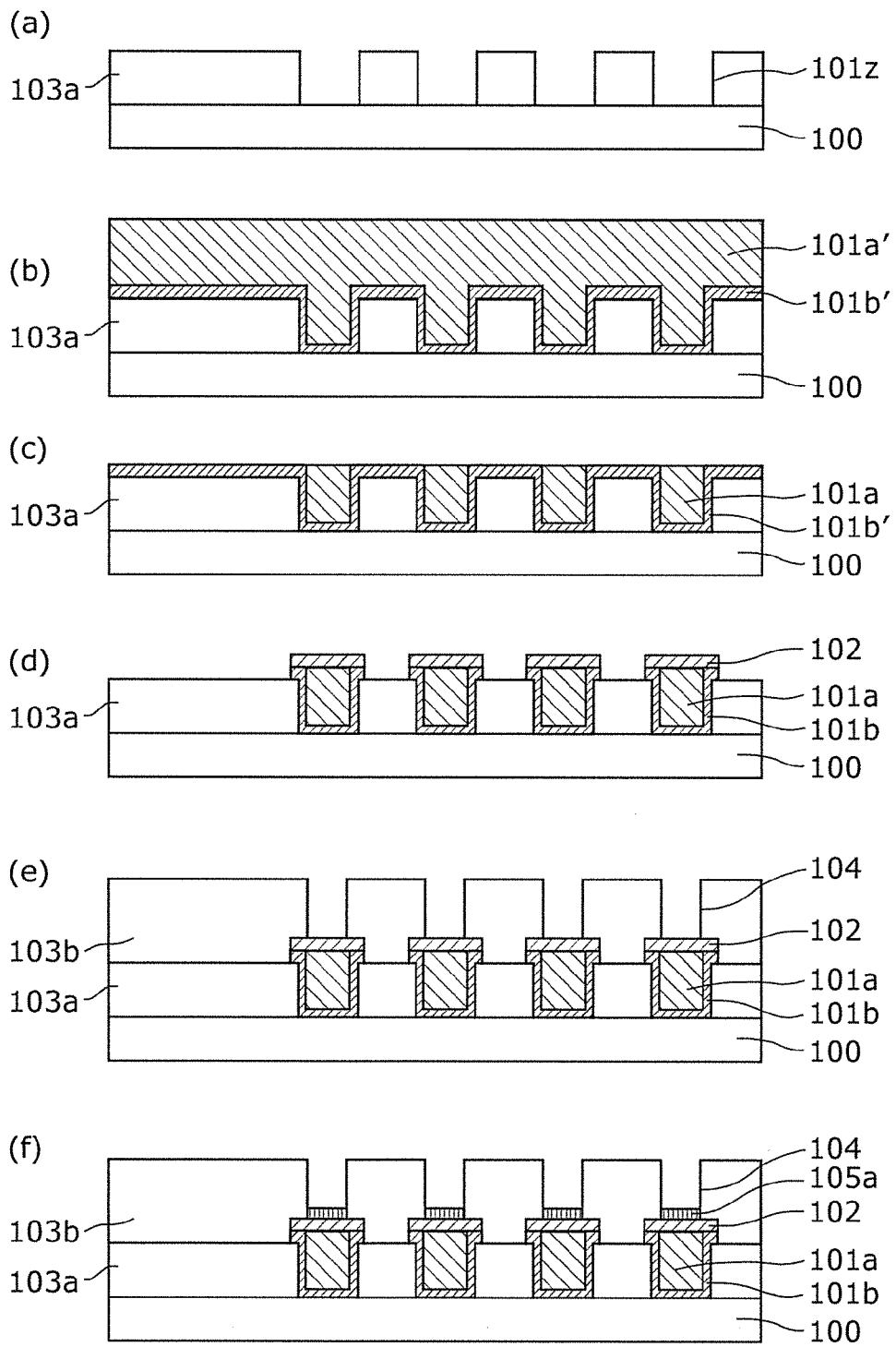
[FIG. 11] Parts (a) to (f) of FIG. 11 are cross-sectional views illustrating the method for manufacturing the non-volatile storage device and taken along 1B-1B' in FIG. 1 according to Embodiment 2 of the present invention.
Figure 12:
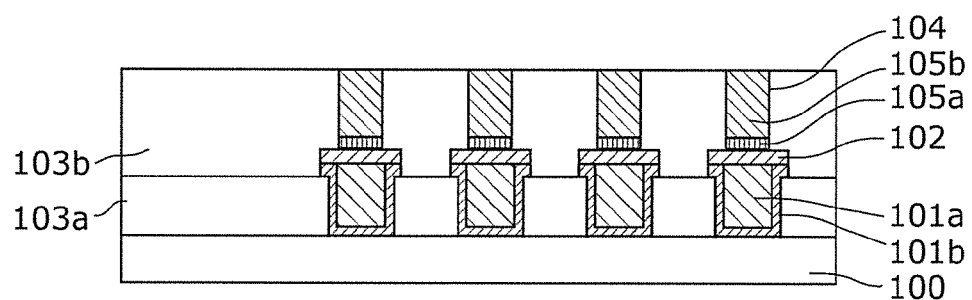
[FIG. 12] Parts (a) and (b) of FIG. 12 are cross-sectional views illustrating the method for manufacturing the non-volatile storage device and taken along 1B-1B' in FIG. 1 according to Embodiment 2 of the present invention.
Figure 12:
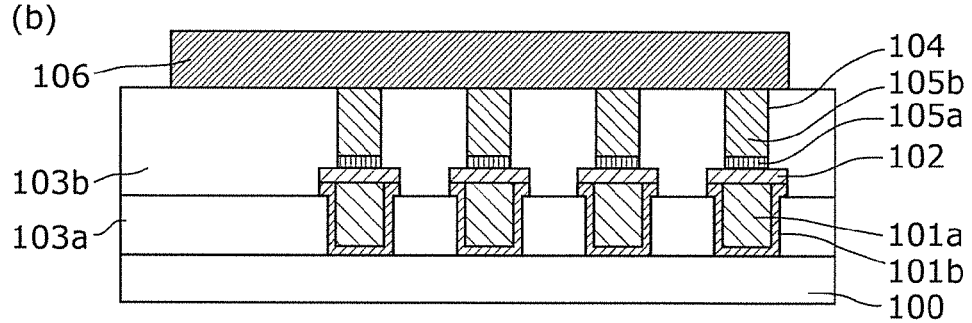

Next is a description of a method for manufacturing the variable resistance non-volatile storage device according to Embodiment 2 of the present invention. FIGS. 9, 10, 11, and 12 are cross-sectional views illustrating the method for manufacturing the non-volatile storage device 30 according to Embodiment 2 of the present invention. FIGS. 9 and 10 are cross-sectional views showing the dashed-line portion along 1A-1A' and viewed in the arrow direction in FIG. 1, and FIGS. 11 and 12 are cross-sectional views showing the dashed-line portion along 1B-1B' and viewed in the arrow direction in FIG. 1. A description is given of the method for manufacturing the non-volatile storage device 30 according to Embodiment 2, with reference to these drawings.

The process of forming line trenches 101z illustrated in (a) of FIG. 9 and (a) of FIG. 11 and the process of forming a barrier metal layer 101b' and a plated layer 101a' comprising, for example, Cu in the line trenches 101z which is illustrated in (b) of FIG. 9 and (b) of FIG. 11 are the same as those of the method for manufacturing the non-volatile storage device 10 according to Embodiment 1, and thus a description thereof is omitted.

Next, as illustrated in (c) of FIG. 9 and (c) of FIG. 11, in the process of forming the first lines 101, only unnecessary Cu above a first interlayer insulating layer 103a and on the barrier metal layer 101b' is removed by CMP, and the main layer 101a is formed only in each of the line trenches 101z. At this time, although the bottom and side surfaces of the main layer 101a of the first lines are covered with the barrier metal layer 101b', the top surface of the main layer 101a is in the state where Cu is exposed, whereas the barrier metal layer 101b' is not removed and is left on the first interlayer insulating layer 103a in the state where the barrier metal layer 101b' is exposed.

Accordingly, the barrier metal layer 101b' and the main layer 101a are formed in each of the line trenches 101z, and the barrier metal layer 101b' is formed on the first interlayer insulating layer 103a other than the line trenches. The polishing selection ratio of the main layer 101a and the barrier metal layer 101b' can be improved by appropriately selecting polishing slurry, thereby reliably leaving the barrier metal layer 101b' on the first interlayer insulating layer 103a.

Next, as illustrated in (d) of FIG. 9 and (d) of FIG. 11, in the process of forming the first electrodes 102, a conductive layer comprising, for example, platinum is formed so as to cover the main layer 101a of the first lines in the line trenches 101z and a part of the barrier metal layer 101b' on the first interlayer insulating layer 103a. The first electrodes 102 comprising platinum are formed by etching using a desired mask, and at that time, the unnecessary portion of the barrier metal layer 101b' is also removed by over etching.

By such manufacturing processes, the barrier metal layer 101b serving as an adhesion layer remains between the first interlayer insulating layer 103a and the first electrodes 102, and thus there is no concern about detachment of the first electrodes 102 from the first interlayer insulating layer 103a (similar effects are achieved by using other precious metals).

Two dimensionally, the first electrodes 102 are formed so as to cover the first lines in the first area 101A, as illustrated in FIG. 1. This prevents an etching damage caused when memory cell holes 104 are formed from being imposed on the main layer 101a of the first lines.

It should be noted that the first electrodes 102 are formed having a greater width than the width of the main layer 101a in the first area 101A so as to cover the main layer 101a of the first lines in the first area 101A and also so as to be in contact with the barrier metal layer 101b, as in Embodiment 1. The effects obtained according to this are as described in Embodiment 1.

In addition, each of the first electrodes 102 is formed in a linear form across the memory cell holes 104 so that the memory cell holes 104 share the first electrode 102. A photoresist pattern used when the platinum layer is patterned into the first electrodes 102 can be increased in size by adopting such a linear-shaped electrode, compared with a dot-shaped electrode formed for each of the memory cell holes, which secures the adhesion between the platinum layer and the photoresist with ease. Therefore, the minimum process size can be even decreased.

The process of forming the memory cell holes 104, the process of forming the first variable resistance layer 105a, the process of forming the second variable resistance layer 105b, the process of forming the extraction contact, and the process of forming the second lines 106 and the extraction line 109 illustrated in the following drawings, or specifically, (e) and (f) of FIG. 9, (a) to (c) of FIG. 10, (e) and (f) of FIG. 11, and (a) and (b) of FIG. 12 are the same as the method for manufacturing the non-volatile storage device 10 according to Embodiment 1 described above, and thus a description thereof is omitted.

Embodiment 3

Figure 13:
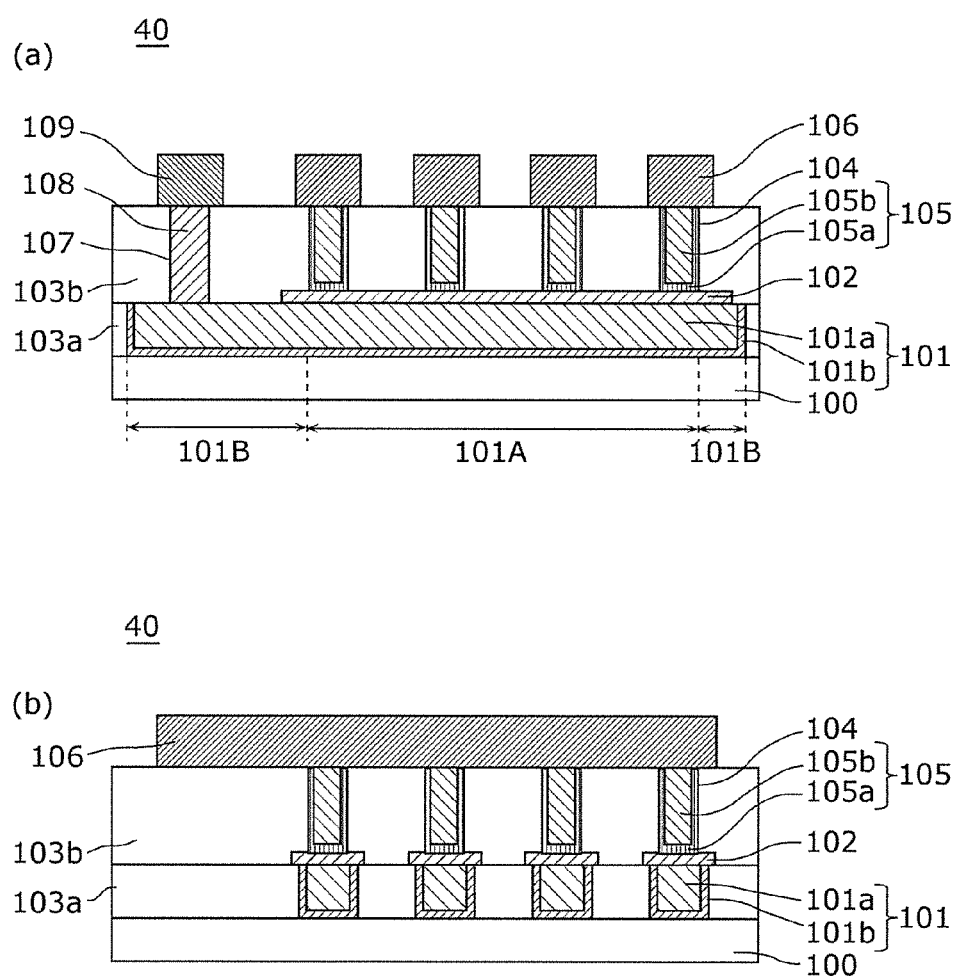
[FIG. 13] Parts (a) and (b) of FIG. 13 are important part cross-sectional views of a non-volatile storage device taken along 1A-1A' and 1B-1B' in FIG. 1 according to Embodiment 3 of the present invention.

Parts (a) and (b) of FIG. 13 are cross-sectional views illustrating an example of a configuration of a variable resistance non-volatile storage device 40 according to Embodiment 3 of the present invention. Part (a) of FIG. 13 is a cross-sectional view showing a dashed-line portion indicated by 1A-1A' and viewed in the arrow direction in FIG. 1, and (b) of FIG. 13 is a cross-sectional view showing a dashed-line portion indicated by 1B-1B' and viewed in the arrow direction in FIG. 1.

Here, the difference from the non-volatile storage device 10 according to Embodiment 1 is that the first variable resistance layer 105a of the variable resistance element is formed not only on the bottom of each of the memory cell holes 104 but on the side wall thereof. When two-dimensionally viewed, the first variable resistance layer 105a is formed in ring shape along the inner wall (side wall) of each of the memory cell holes 104, and furthermore the second variable resistance layer 105b is formed inside thereof.

The first variable resistance layer 105a is formed so as to have a higher oxygen content than that of the second variable resistance layer 105b. Consequently, the first variable resistance layer 105a has a high resistance relative to the second variable resistance layer 105b, and thus cell current (current which flows the inside of a memory cell) hardly flows via the first variable resistance layer 105a formed on the side wall portion of each of the memory cell holes 104. Thus, cell current concentratedly flows through the second low variable resistance layer 105b having a relatively low resistance and formed on the inner side, thereby allowing a resistance change to be caused stably on the bottom near the center of the memory cell holes 104.

Accordingly, the area through which current flows is decreased, compared to the case in which the variable resistance layer 105 is not formed on the inner wall of the memory cell holes 104 as in Embodiments 1 and 2, thereby achieving effects of reducing cell current and power consumption. In addition, the variable resistance layer can be formed by sputtering, CVD, or the like by providing the first variable resistance layer 105a not only on the bottom of the memory cell holes but on the side wall thereof, which achieves merits of easily obtaining the variable resistance layer in view of the manufacturing method.

It should be noted that the other constituent elements of the variable resistance non-volatile storage device 40 are the same as the variable resistance non-volatile storage device 10 described in Embodiment 1, and thus a description thereof is omitted. In addition, regarding the manufacturing method, the process of forming the variable resistance layer 105 is as described above, and the other processes of the manufacturing method are the same as in Embodiment 1, and thus a description thereof is omitted.

Embodiment 4

Figure 14:
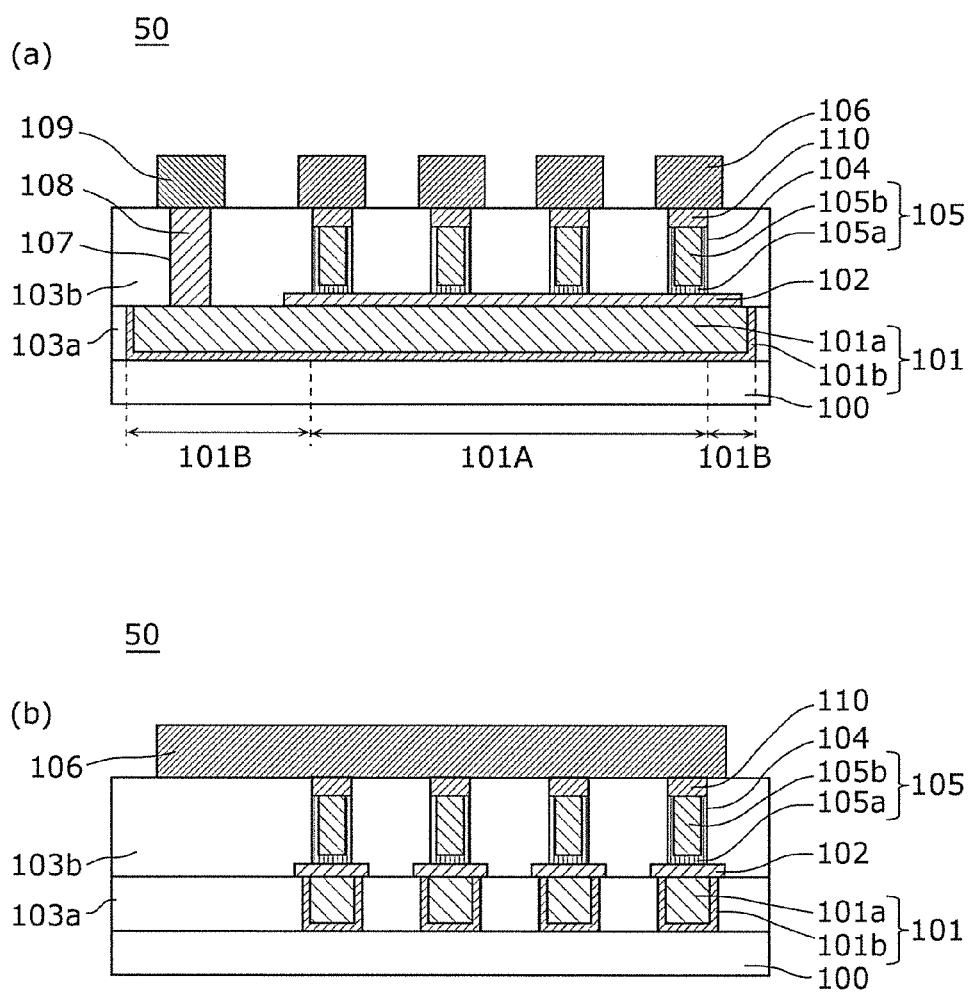
[FIG. 14] Parts (a) and (b) of FIG. 14 are important part cross-sectional views of a non-volatile storage device taken along 1A-1A' and 1B-1B' in FIG. 1 according to Embodiment 4 of the present invention.

Parts (a) and (b) of FIG. 14 are cross-sectional views illustrating an example of the configuration of a variable resistance non-volatile storage device 50 according to Embodiment 4 of the present invention. Part (a) of FIG. 14 is a cross-sectional view showing a dashed-line portion indicated by 1A-1A' and viewed in the arrow direction in FIG. 1, and (b) of FIG. 14 is a cross-sectional view showing a dashed-line portion indicated by 1B-1B' and viewed in the arrow direction in FIG. 1.

Here, the difference from the non-volatile storage device 40 described in Embodiment 4 is that second electrodes 110 are embedded in the upper part of the memory cell holes 104, and the second lines 106 are formed being connected to the second electrodes 110. Such a configuration allows a decrease in the thickness of the second variable resistance layer 105b (thickness in the substrate thickness direction) by the thickness of the second electrodes 110 embedded in the memory cell holes (at least 20 nm and at most 100 nm). Consequently, the electric fields in the first variable resistance layer 105a and the second variable resistance layer 105b are increased, which enables operations at a low voltage.

In addition, the use of a tantalum nitride as the second electrodes 110 is preferable for manufacturing, with ease, the non-volatile storage device excellent in performance characteristics since a tantalum nitride is easily embedded into the memory cell holes 104, and has a relatively low standard electrode potential. In addition, it is preferable to use a conductive material mainly containing Cu for the second lines 106 to suppress a rise in line resistance. In this way, the materials of the second electrodes 110 and the second lines 106 can be each selected according to their usage.

It should be noted that the other constituent elements of the variable resistance non-volatile storage device 50 are the same as the variable resistance non-volatile storage device 10 described in Embodiment 1, and thus a description thereof is omitted. In addition, regarding the manufacturing method, the method of embedding the second electrodes 110 is as described above, and the other processes of the manufacturing method are the same as in Embodiment 3, and thus a description thereof is omitted.

Embodiment 5

Configuration of Variable Resistance Non-Volatile Storage Device

Figure 15:
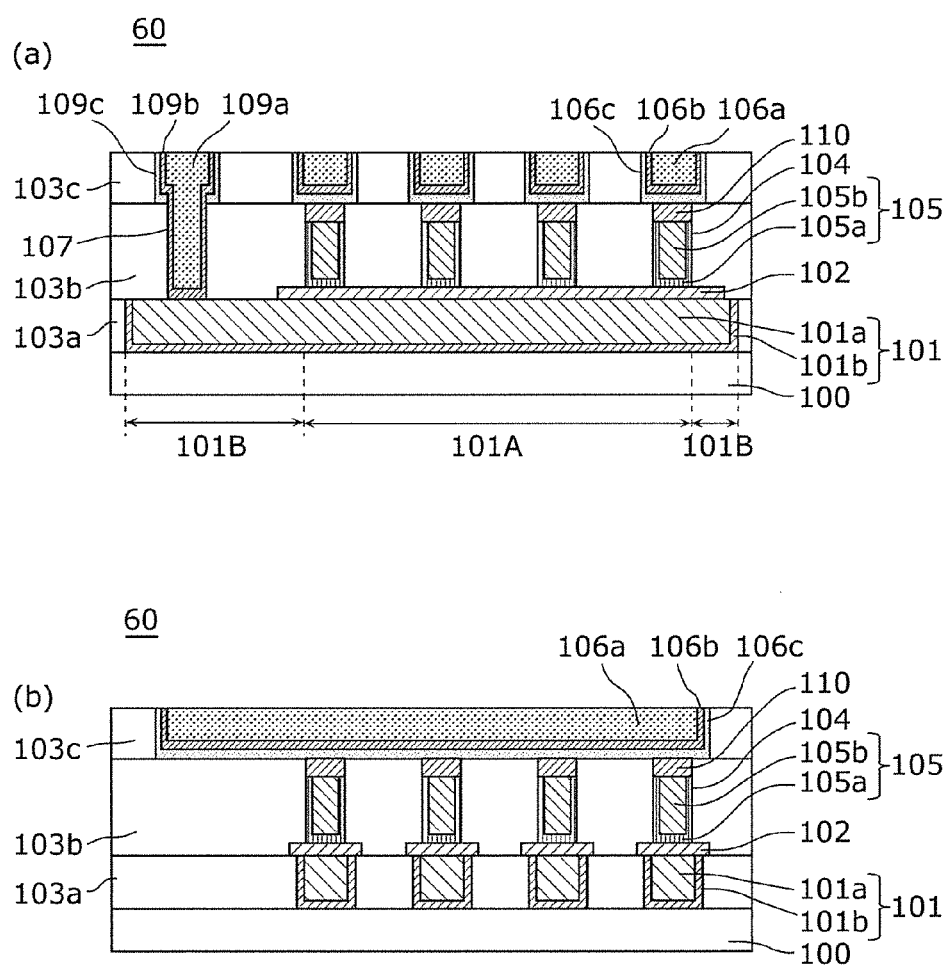
[FIG. 15] Parts (a) and (b) of FIG. 15 are important part cross-sectional views of a non-volatile storage device taken along 1A-1A' and 1B-1B' in FIG. 1 according to Embodiment 5 of the present invention.

Parts (a) and (b) of FIG. 15 are cross-sectional views illustrating an example of the configuration of a variable resistance non-volatile storage device 60 according to Embodiment 5 of the present invention. Part (a) of FIG. 15 is a cross-sectional view showing a dashed-line portion indicated by 1A-1A' and viewed in the arrow direction in FIG. 1, and (b) of FIG. 15 is a cross-sectional view showing a dashed-line portion indicated by 1B-1B' and viewed in the arrow direction in FIG. 1.

As illustrated in (a) and (b) of FIG. 15, the non-volatile storage device 60 according to Embodiment 5 includes: a substrate 100 on which first lines 101 are formed; a first interlayer insulating layer 103a formed between the first lines 101 on the substrate 100; a second interlayer insulating layer 103b formed on the first lines 101 and the first interlayer insulating layer 103a; and first electrodes 102 formed so as to cover the first lines in a first area 101A. Furthermore, the first lines 101 each include a main layer 101a comprising, for example, Cu, and the barrier metal layer 101b.

Furthermore, the non-volatile storage device 60 includes contact holes 107 formed through the second interlayer insulating layer 103b and connected to the first lines 101 in a second area 101B. Also, a first variable resistance layer 105a (having a thickness of at least 1 nm and at most 10 nm) is formed on the bottom and the side wall of memory cell holes 104 and in contact with the first electrodes 102, and a second variable resistance layer 105b is formed thereon. The memory cell holes 104 are each filled with the two types of layers.

The memory cell holes 104 each have a depressed portion (having a depth of at least 20 nm and at most 100 nm) at the upper part thereof, and second electrodes 110 are each embedded and formed in the depressed portion so as to cover the first variable resistance layer 105a and the second variable resistance layer 105b.

Furthermore, a third interlayer insulating layer 103c which includes a silicon oxide film is formed on the second interlayer insulating layer 103b. A semiconductor layer 106c is formed on the bottom and side walls of line trenches formed in the third interlayer insulating layer 103c, so as to cover the second electrodes 110. In addition, a conductive barrier metal layer 106b (which also serves as the electrode of diodes) and a main layer 106a are formed so as to at least cover the semiconductor layer 106c on the second electrodes 110. Second lines 106 each include the semiconductor layer 106c, the barrier metal layer 106b, and the main layer 106a.

Each of the contact holes 107 formed in the second interlayer insulating layer 103b has a barrier metal layer 109b which functions as an adhesion layer, and a main layer 109a filled inside thereof. In a line trench over the contact holes 107, an extraction line 109 is formed which includes a semiconductor layer 109c, the barrier metal layer 109b, and the main layer 109a. The semiconductor layer 109c is removed at the opening via which the extraction line 109 and the contact holes 107 are connected so as to allow ohmic contact, and the barrier metal layer 109b and the main layer 109a in the contact hole are formed integrally with those in the extraction line 109, respectively.

Variable resistance elements each include the first electrode 102, the first variable resistance layer 105a, the second variable resistance layer 105b, and the second electrode 110, and diode elements each include the second electrode 110, the semiconductor layer 106c, and the barrier metal layer 106b.

Such a configuration allows bidirectional diodes each including the semiconductor layer 106c interposed between the second electrode 110 and the conductive barrier metal layer 106b to be formed at the upper part of the memory cell holes, in addition to embedding the variable resistance elements at the bottom of the memory cell holes 104.

Even if a bipolar-type variable resistance element whose resistance changes due to the application of voltages having different polarities is used as a variable resistance element of the above bidirectional diode, the diode can be turned on in the regions of the applied voltage, one of which is greater than or equal to a positive threshold voltage of the diode and the other of which is lower than or equal to a negative threshold voltage of the diode. This achieves a highly integratable variable resistance non-volatile storage device whose capacity can be increased without providing a switching element such as a transistor.

In addition, the first variable resistance layer 105a having a higher oxygen content than that of the second variable resistance layer 105b is disposed on the bottom of the memory cell holes 104 and connected to the first electrodes 102, and the second variable resistance layer 105b having a low oxygen content is disposed thereon. Accordingly, a resistance is reliably changed in the interfacial region of the first electrodes 102, and a polarity at which the resistance changes is determined, thereby achieving a variable resistance element having stable memory characteristics.

Furthermore, in the configuration of each diode element described above, the area in which the barrier metal layer 106b and the semiconductor layer 106c are in contact is greater than the area in which the second electrode 110 and the semiconductor layer 106c are in contact, and thus lines of electric force spread even around the second electrodes 110, and current flow capability can be improved. With the above configuration, a current necessary to cause a stable resistance change can be sufficiently secured.

Here, each diode element comprises tantalum nitride (TaN) as the second electrode 110 and the barrier metal layer 106b, and includes a nitrogen-deficient silicon nitride film ($SiN_z$, $0<z<0.85$) as the semiconductor layer 106c, for example. A work function of a tantalum nitride is 4.76 eV, and is sufficiently higher than the electron affinity of silicon which is 3.78 eV. Consequently, a Schottky barrier is formed at the interface, and metal-semiconductor-metal (MSM) diodes having bidirectional diode characteristics are obtained.

In addition to this, the second electrodes 110 comprising tantalum nitride also serve as upper electrodes of the variable resistance elements, and comprise, as electrodes which do not change the resistance of variable resistance elements, a material having a lower standard electrode potential than that of the first electrodes 102, as described above. In addition, the second electrodes 110 have characteristics compatible with (good adhesion to) a seed layer (not illustrated, comprising Cu) of the second lines 106 comprising Cu. It should be noted that typical examples of the other constituent elements of the variable resistance non-volatile storage device 60 are the same as the variable resistance non-volatile storage device 10, and thus a description thereof is omitted.

Method for Manufacturing Variable Resistance Non-Volatile Device

Figure 16:
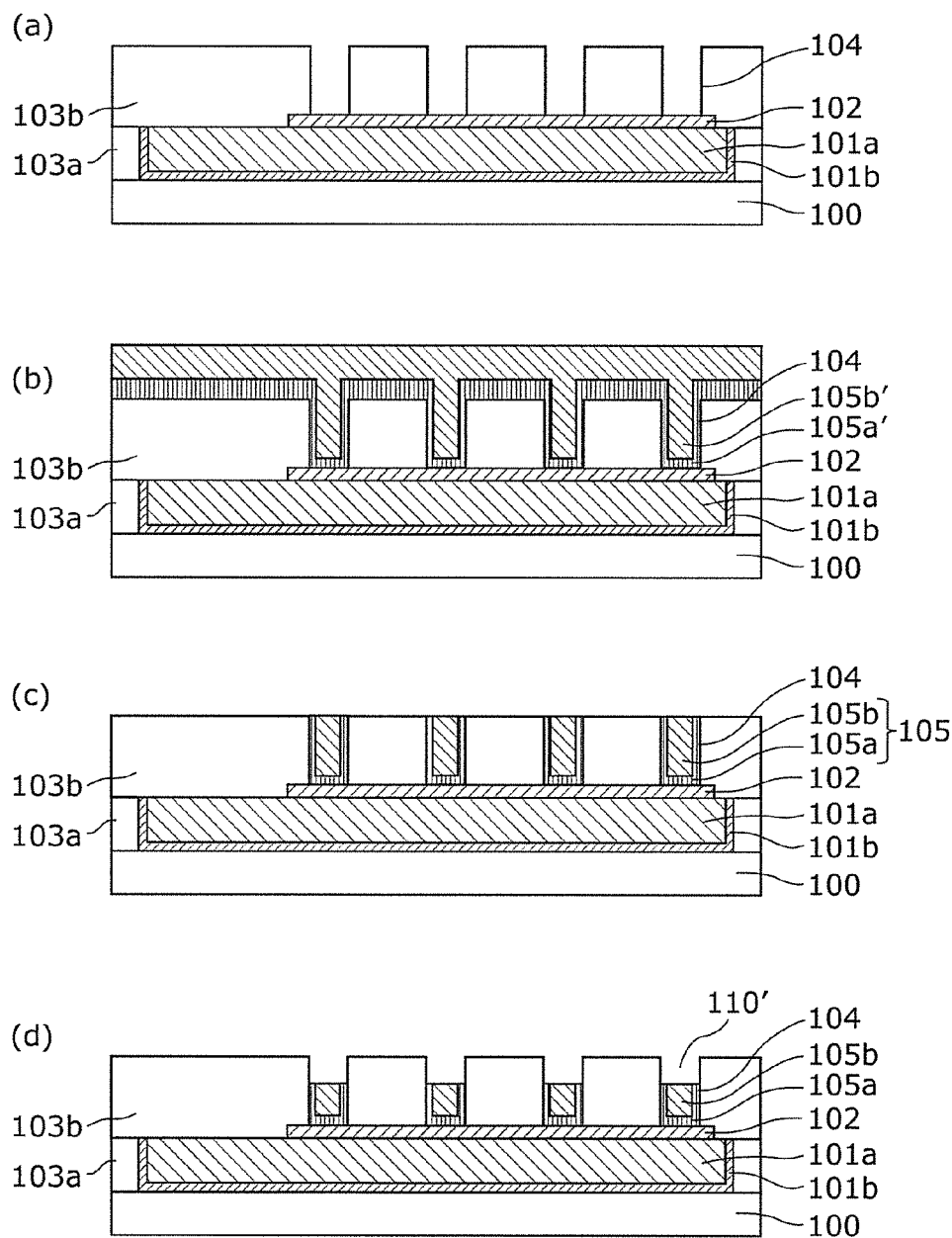
[FIG. 16] Parts (a) to (d) of FIG. 16 are cross-sectional views illustrating a method for manufacturing the non-volatile storage device and taken along 1A-1A' in FIG. 1 according to Embodiment 5 of the present invention.
Figure 17:
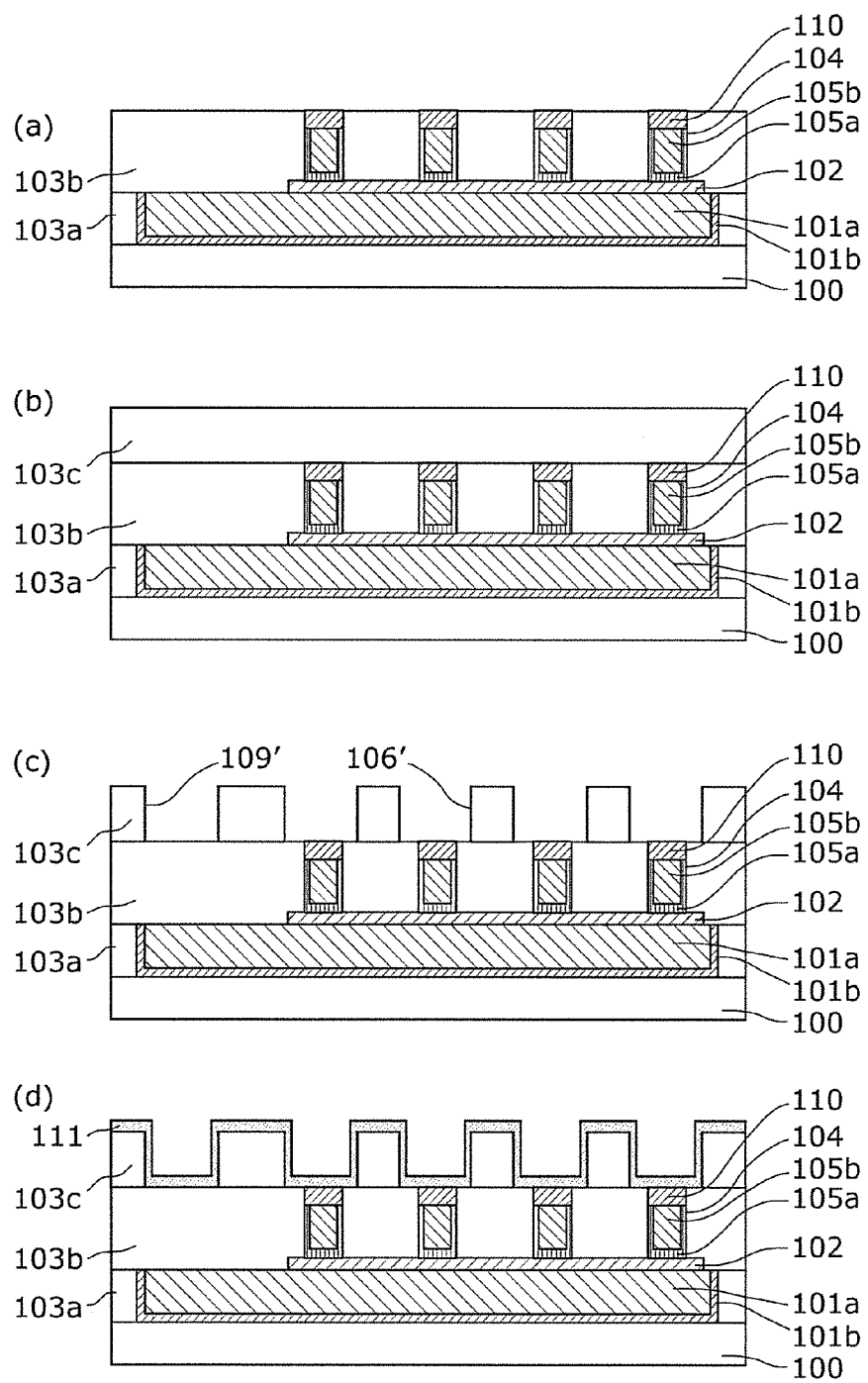
[FIG. 17] Parts (a) to (d) of FIG. 17 are cross-sectional views illustrating the method for manufacturing the non-volatile storage device and taken along 1A-1A' in FIG. 1 according to Embodiment 5 of the present invention.
Figure 18:
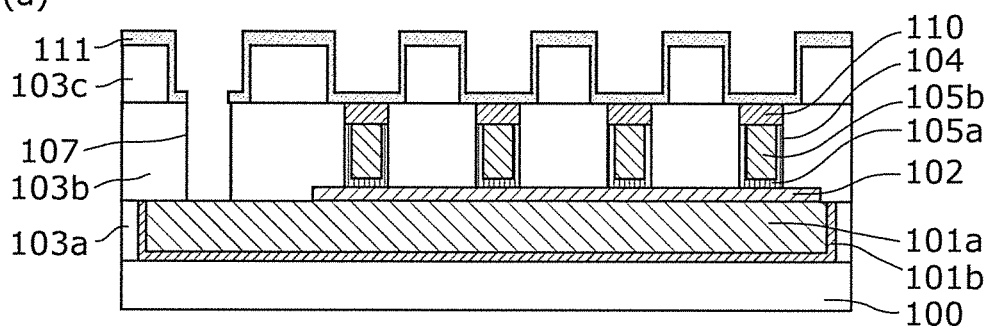
[FIG. 18] Parts (a) to (c) of FIG. 18 are cross-sectional views illustrating the method for manufacturing the non-volatile storage device and taken along 1A-1A' in FIG. 1 according to Embodiment 5 of the present invention.
Figure 18:
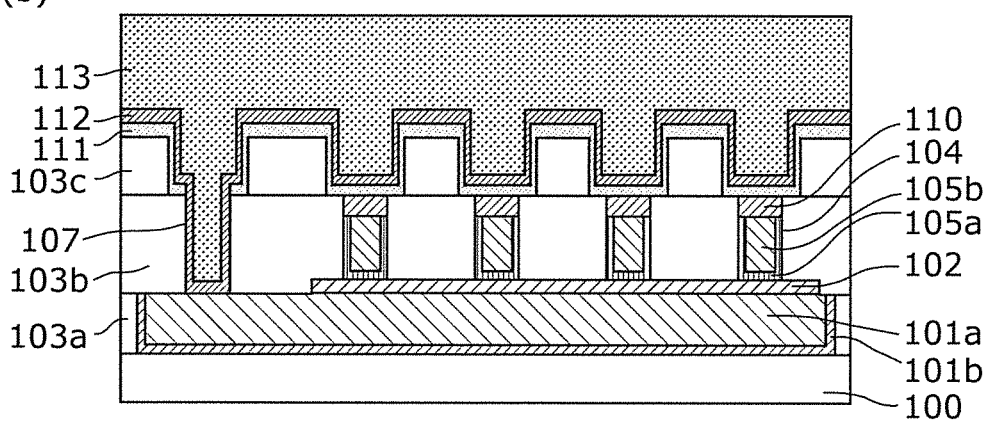
Figure 18:
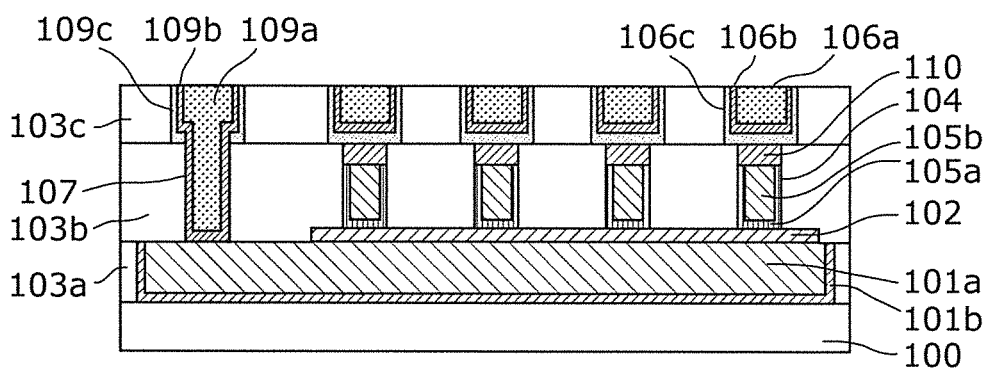

Next is a description of a method for manufacturing the variable resistance non-volatile storage device according to Embodiment 5. FIGS. 16, 17, and 18 are cross-sectional views illustrating the method for manufacturing the non-volatile storage device 60 according to Embodiment 5. All the drawings are cross-sectional views showing the dashed-line portion indicated by 1A-1A' and viewed in the arrow direction in FIG. 1. A description is given of the method for manufacturing the non-volatile storage device 60 according to Embodiment 5, with reference to these drawings. It should be noted that the processes before the process illustrated in (a) of FIG. 16 are the same as those illustrated in (a) to (d) of FIG. 4 and (a) to (d) of FIG. 6, and thus a description thereof is omitted.

As illustrated in (a) of FIG. 16, in the process of forming the memory cell holes 104, the second interlayer insulating layer 103b which includes a silicon oxide film is formed on the entire surface so as to cover the first electrodes 102. Then, the surface of the second interlayer insulating layer 103b is planarized, and thereafter the memory cell holes 104 connected with the first electrodes 102 through the second interlayer insulating layer 103b are formed.

Next, as illustrated in (b) of FIG. 16, in the process of forming the variable resistance layer 105, first, tantalum oxide is deposited, as the first variable resistance layer 105a', on the bottom and side wall portions of the memory cell holes 104 and the second interlayer insulating layer 103b, by sputtering a tantalum target in argon-oxygen gas atmosphere, or in other words, so-called reactive sputtering. Subsequently, tantalum oxide as the second variable resistance layer 105b' having a lower oxygen content than that of the first variable resistance layer 105a' is deposited by reactive sputtering in a similar manner, until the inside of the memory cell holes 104 are completely filled.

Here, the first variable resistance layer 105a' having an oxygen content of about 71 atm % is formed under the following conditions, namely, argon 34 sccm, oxygen 24 sccm, and power 1.6 kW, whereas the second variable resistance layer 105b' having an oxygen content of about 55 atm % is formed under the following conditions, namely, argon 34 sccm, oxygen 20.5 sccm, and power 1.6 kW. Here, although sputtering is used, CVD or atomic layer deposition (ALD) having favorable characteristics for embedding into minute holes may be used.

Next, as illustrated in (c) of FIG. 16, in the process of forming the variable resistance layer 105, unnecessary tantalum oxide on the second interlayer insulating layer 103b is removed by CMP, and the first variable resistance layer 105a and the second variable resistance layer 105b are formed only in the memory cell holes 104. Accordingly, as illustrated in (b) and (c) of FIG. 16, when the second variable resistance layer 105b is formed on the bottom of the memory cell holes 104, the variable resistance layer 105 can be formed without performing an etching process which causes concern such as a reaction with etching gas, a damage due to oxygen reduction, and a damage due to charging.

Next, as illustrated in (d) of FIG. 16, in the process of forming depressed portions 110' in the second interlayer insulating layer 103b, etchback is performed on the underlayer having the first variable resistance layer 105a formed on the bottom and side wall of each of the memory cell holes 104 and the second variable resistance layer 105b embedded and formed inside thereof, under the conditions that the first variable resistance layer 105a and the second variable resistance layer 105b are selectively etched, relative to the second interlayer insulating layer 103b. Accordingly, the depressed portions 110' are formed in the memory cell holes 104. The depth of the depressed portions is about at least 20 nm and at most 100 nm.

In addition, rather than forming the depressed portions 110' using etchback, the depressed portions 110' may be formed by overpolishing of CMP, as an extension of the process of (c) of FIG. 16. In this case, it is more preferable to form the second interlayer insulating layer 103b so as to have a stack structure, and provide, on the upper layer side, a silicon nitride film which is less likely to be polished by CMP. A silicon nitride film is less likely to be polished under the condition that the first variable resistance layer 105a and the second variable resistance layer 105b which comprise a transition metal oxide are polished, and allows the depressed portions 110' to be easily formed.

Next, as illustrated in (a) of FIG. 17, in the process of forming the second electrodes 110, a tantalum nitride layer is formed on the entire surface so as to cover the depressed portions 110' in the memory cell holes 104. After that, unnecessary tantalum nitride on the second interlayer insulating layer 103b are removed by CMP, and the second electrodes 110 comprising tantalum nitride is formed only in the memory cell holes 104. Here, the tantalum nitride layer is formed by sputtering a tantalum target in argon-nitrogen gas atmosphere, or in other words, so-called reactive sputtering.

Next, as illustrated in (b) of FIG. 17, in the process of forming the third interlayer insulating layer 103c, the third interlayer insulating layer 103c (having a thickness of at least 100 nm and at most 300 nm) which includes a silicon oxide film is formed on the second interlayer insulating layer 103b.

Next, as illustrated in (c) of FIG. 17, in the process of forming line trenches 106' and 109', the third interlayer insulating layer 103c is patterned using a desired mask, thereby forming the line trenches 106' and 109' for later embedding the second lines 106 and the extraction line 109, for instance. At this time, the second electrodes 110 are exposed on the bottom of the line trenches 106'.

Next, as illustrated in (d) of FIG. 17, in the process of forming a semiconductor layer 111, the semiconductor layer 111 which includes a nitrogen-deficient silicon nitride film is formed on the entire surface which includes the line trenches 106' in which the second electrodes 110 are exposed and the line trench 109' for embedding the extraction line. A nitrogen-deficient silicon nitride film is formed by sputtering a silicon target in argon-nitrogen gas atmosphere, or in other words, so-called reactive sputtering. A nitrogen content thereof is at least 25 atm % and at most 40 atm %.

Next, in the process of forming the contact holes 107 as illustrated in (a) of FIG. 18, the contact holes 107 are formed which are connected to the first lines 101 through the semiconductor layer 111 and the second interlayer insulating layer 103b which are formed in the line trench 109'.

Next, as illustrated in (b) of FIG. 18, in the process of forming the second lines 106 and the extraction line 109, a barrier metal layer 112 which comprises tantalum nitride is formed on the entire surface so as to cover the contact holes 107 and the semiconductor layer 111 on the line trenches 106' and 109' and the second interlayer insulating layer 103b. Subsequently, a plated layer 113 which comprises Cu is formed so as to fill the line trenches 106' and 109' and the contact holes 107.

Finally, as illustrated in (c) of FIG. 18, in the process of forming the second lines 106 and the extraction line 109, unnecessary Cu, tantalum nitride, and the nitrogen-deficient silicon nitride film on the third interlayer insulating layer 103c are removed by CMP, and the second lines 106 are formed only in the line trenches 106', the third lines 106 each including the semiconductor layer 106c which includes the nitrogen-deficient silicon nitride film, the barrier metal layer 106b which comprises tantalum nitride, and the main layer 106a. In contrast, the extraction line 109 which includes the main layer 109a and the barrier metal layer 109b comprising tantalum nitride and serving as an adhesion layer is formed in the contact holes 107 and the line trench 109'.

By using such a manufacturing method, variable resistance elements each includes the first electrode 102, the first variable resistance layer 105a, the second variable resistance layer 105b, and the second electrode 110, a resistance can be reliably changed at the interfacial region of the first electrodes 102, and a polarity at which the resistance changes is always stabilized, thereby achieving stable memory characteristics. In addition, MSM diode elements each include the second electrode 110, the semiconductor layer 106c, and the barrier metal layer 106b, and MSM diodes which are bidirectional diodes can be formed at the upper part of the memory cell holes. Thus, there is no need to provide switching elements such as transistors. The above configuration achieves a hole filling type, highly integratable variable resistance non-volatile storage device whose capacity can be increased and which is suitable for miniaturization.

Embodiment 6

Figure 19:
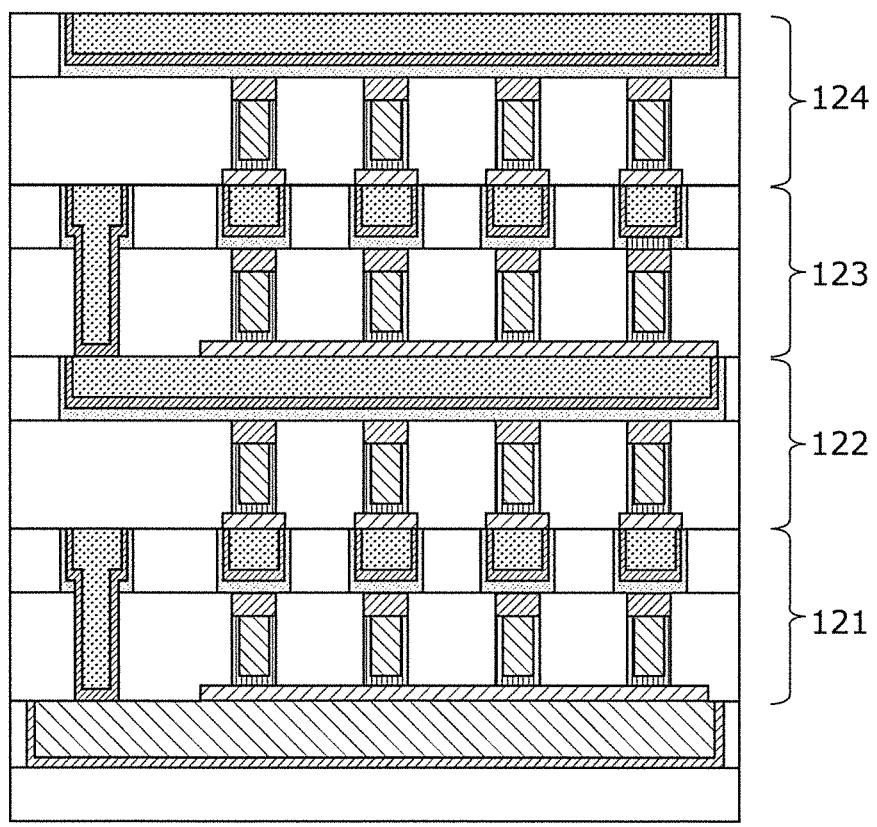
[FIG. 19]

FIG. 19 is a cross-sectional view illustrating an example of the configuration of a variable resistance non-volatile storage device 70 according to Embodiment 6 of the present invention. The variable resistance non-volatile storage device 70 according to Embodiment 6 of the present invention includes the three-dimensionally multilayered variable resistance non-volatile storage devices 60 according to Embodiment 5 of the present invention.

Specifically, the first electrodes 102, the second interlayer insulating layer 103b, the third interlayer insulating layer 103c, the second lines 106, the extraction line 109, and the variable resistance layer 105 and the second electrodes 110 embedded in the memory cell holes 104 are assumed to be included in a first memory cell layer 121 which is one configuration unit. Furthermore, three layers from a second memory cell layer 122 to a fourth memory cell layer 124 each having the same configuration as that of the first memory cell layer 121 are further provided on the first memory cell layer 121. Although the present embodiment describes a crosspoint memory structure having four layers from the first memory cell layer 121 to the fourth memory cell layer 124, the structure may include still more layers to obtain a larger capacity memory.

The multilayered configuration as described above enables lines in the crosspoint memory portion to be three-dimensionally connected to one another over the shortest distance, and achieves a highly reliable and integrated non-volatile semiconductor memory device.

Example of Operation Showing Resistance Change Characteristics

The following is a description of the results of experiments for confirming that a variable resistance element exhibits favorable resistance change characteristics, the variable resistance element comprising a tantalum oxide (which has a thickness of about 50 nm) used as the variable resistance layer 105 as an example in the embodiments described above.

As the first experiment, a single parallel-plate variable resistance element corresponding to the variable resistance element included in the non-volatile storage devices according to the embodiments was produced for evaluation, and resistance change characteristics thereof were evaluated.

Figure 20:
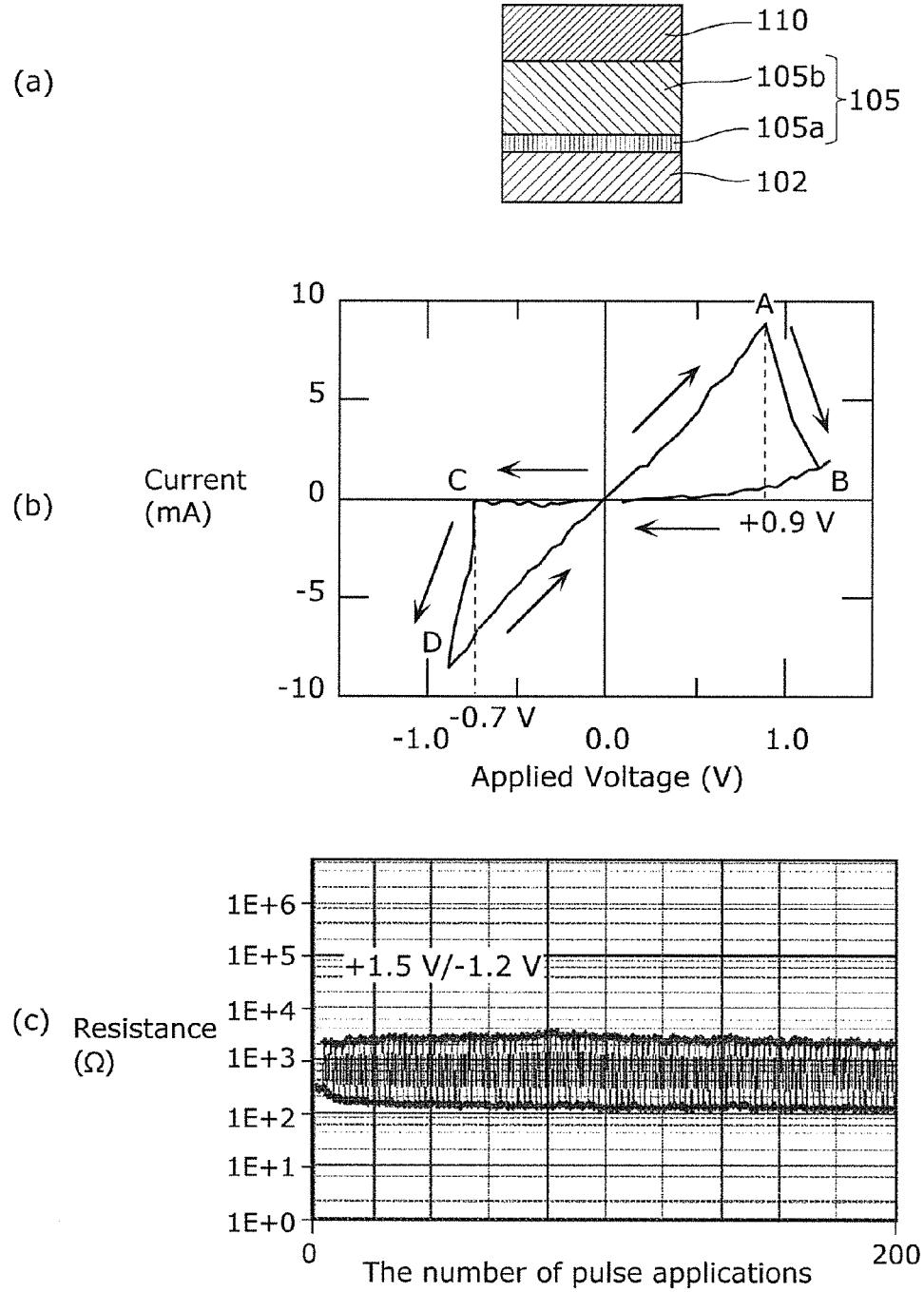
[FIG. 20] Part (a) of FIG. 20 illustrates a variable resistance element having a simple structure, (b) of FIG. 20 is a graph showing current-voltage characteristics of the element, and (c) of FIG. 20 is a graph showing resistance change characteristics thereof.

Part (a) of FIG. 20 illustrates a configuration of a variable resistance element having a simple parallel-plate structure produced in the first experiment, (b) is a graph showing the current-voltage characteristics of the variable resistance element, and (c) is a graph showing resistance changes of the variable resistance element due to electrical pulses.

Here, a tantalum oxide film was used which had a stack structure in which the first variable resistance layer 105a having a thickness of 5 nm and an oxygen content of 71 atm % and the second variable resistance layer 105b having a thickness of 45 nm and an oxygen content of 60 atm % were stacked. In addition, Pt was used for the first electrode 102, and TaN was used for the second electrode 110. The diameter of the element was 0.5 μm.

As illustrated in (a) of FIG. 20, the first variable resistance layer 105a having an oxygen content higher than that of the second variable resistance layer 105b and the second variable resistance layer 105b having an oxygen content lower than that of the second variable resistance layer 105b are formed on the first electrode 102 in this stated order, and the second electrode 110 is further formed thereon.

In the variable resistance element having such a configuration, as illustrated in (b) of FIG. 20, if a positive potential is applied to the first electrode 102 (a positive voltage is applied to the first electrode 102 relative to the potential of the second electrode 110), the state of the element changes from a low resistance state to a high resistance state at point A. The resistance change starting voltage at this time is about +0.9V. Next, the state changes from a high resistance state to a low resistance state at point C by applying a negative potential to the first electrode 102 in this state (applying a negative voltage to the first electrode 102 relative to the potential of the second electrode 110). The resistance change starting voltage at this time is about −0.7V. In this manner, a variable resistance element exhibits resistance change characteristics showing a shift between two states, namely, a high resistance state and a low resistance state due to the application of voltages of different polarities.

Furthermore, (c) of FIG. 20 illustrates a result of the measurement of resistance obtained when electric pulses having a pulse width of 100 ns and voltages of +1.5V and −1.2V relative to the second electrode 110 are alternately applied between the first electrode 102 and the second electrode 110, or specially, to the first electrode 102. In this case, the resistance value is about 1200Ω or more and about 1500Ω or less by applying an electrical pulse having a voltage of +1.5V, whereas the resistance value is about 150Ω by applying an electrical pulse having a voltage of −1.2V, which shows a resistance change by about one order of magnitude. It should be noted that although the above describes a transition metal oxide layer having a stack structure containing tantalum oxide, the stack structure may contain a transition metal oxide other than tantalum oxide, such as hafnium (Hf) oxide or zirconium (Zr) oxide, for example.

Next, as the second experiment, a single hole-type variable resistance element having the above-described variable resistance layer 105 which comprises tantalum oxide and formed in the memory cell hole was produced for evaluation, and resistance change characteristics thereof were evaluated.

Figure 21:
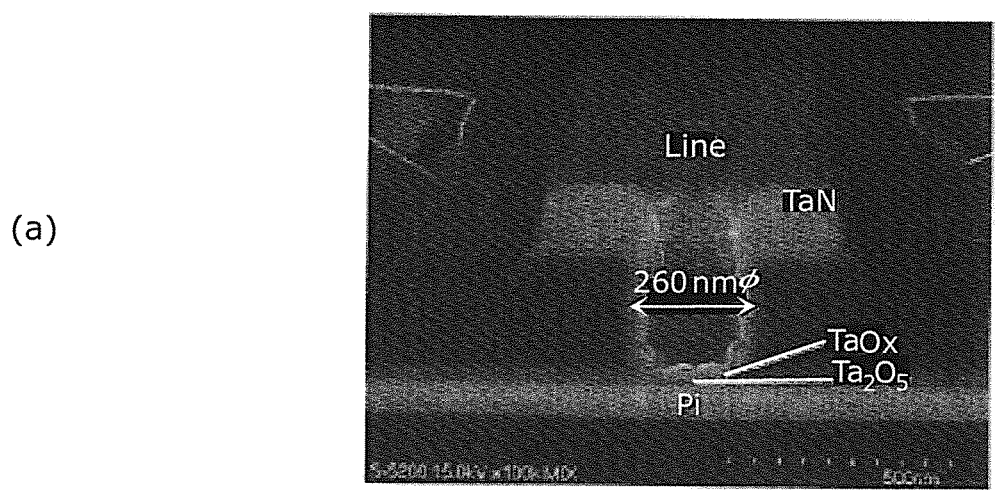
[FIG. 21] Part (a) of FIG. 21 is a cross-sectional view of a variable resistance element having a simple hole structure of 260 nmϕ, and (b) of FIG. 21 is a graph showing resistance change characteristics of the element.
Figure 21:
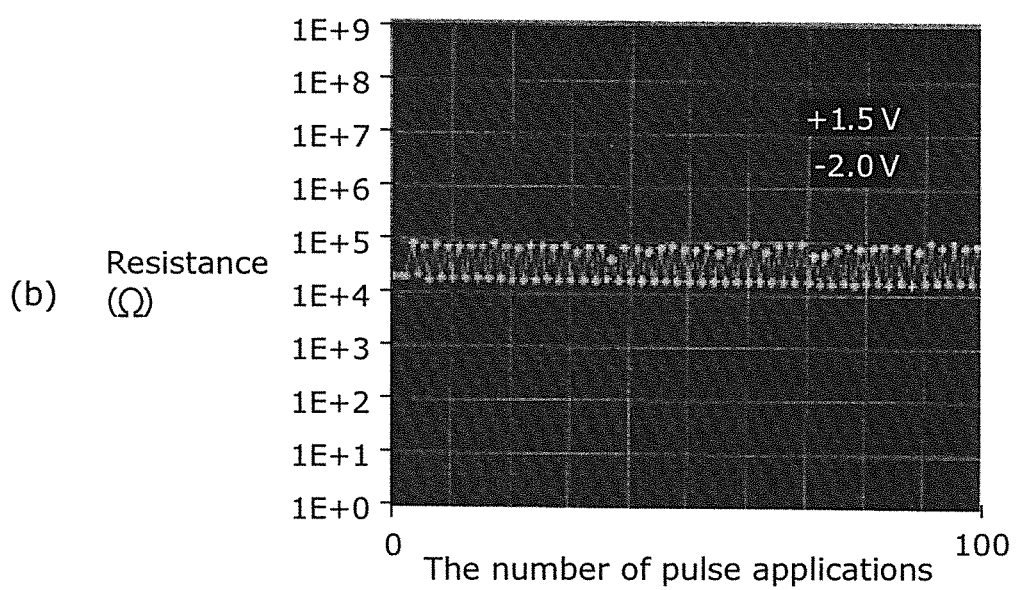
Figure 22:
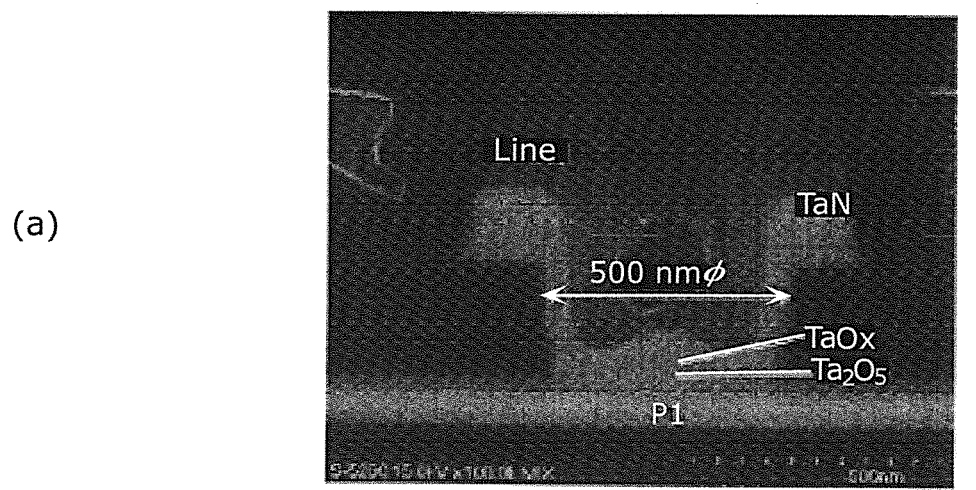
[FIG. 22] Part (a) of FIG. 22 is a cross-sectional view of a variable resistance element having a simple hole structure of 500 nmϕ, and (b) of FIG. 22 is a graph showing resistance change characteristics of the element.
Figure 22:
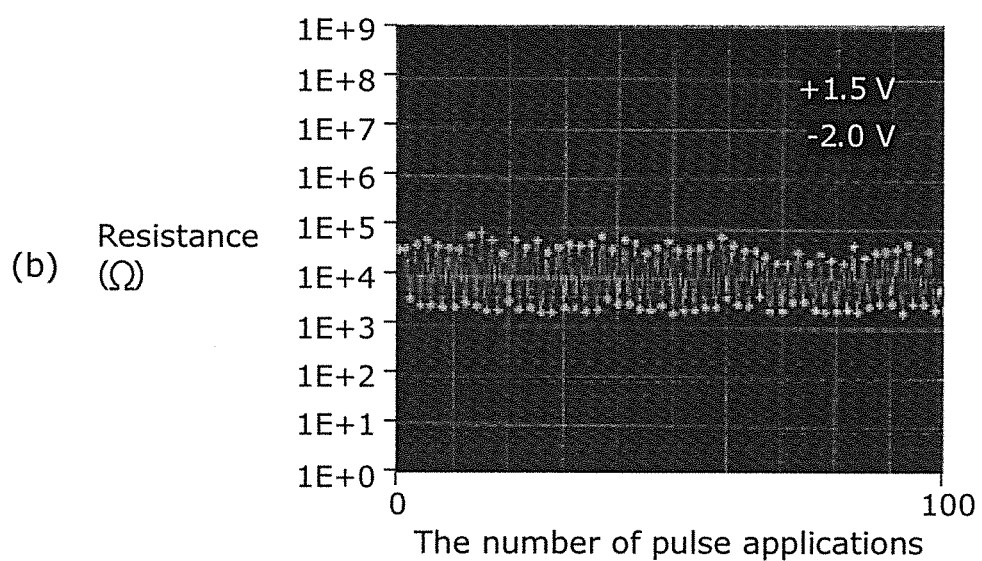
Figure 23:
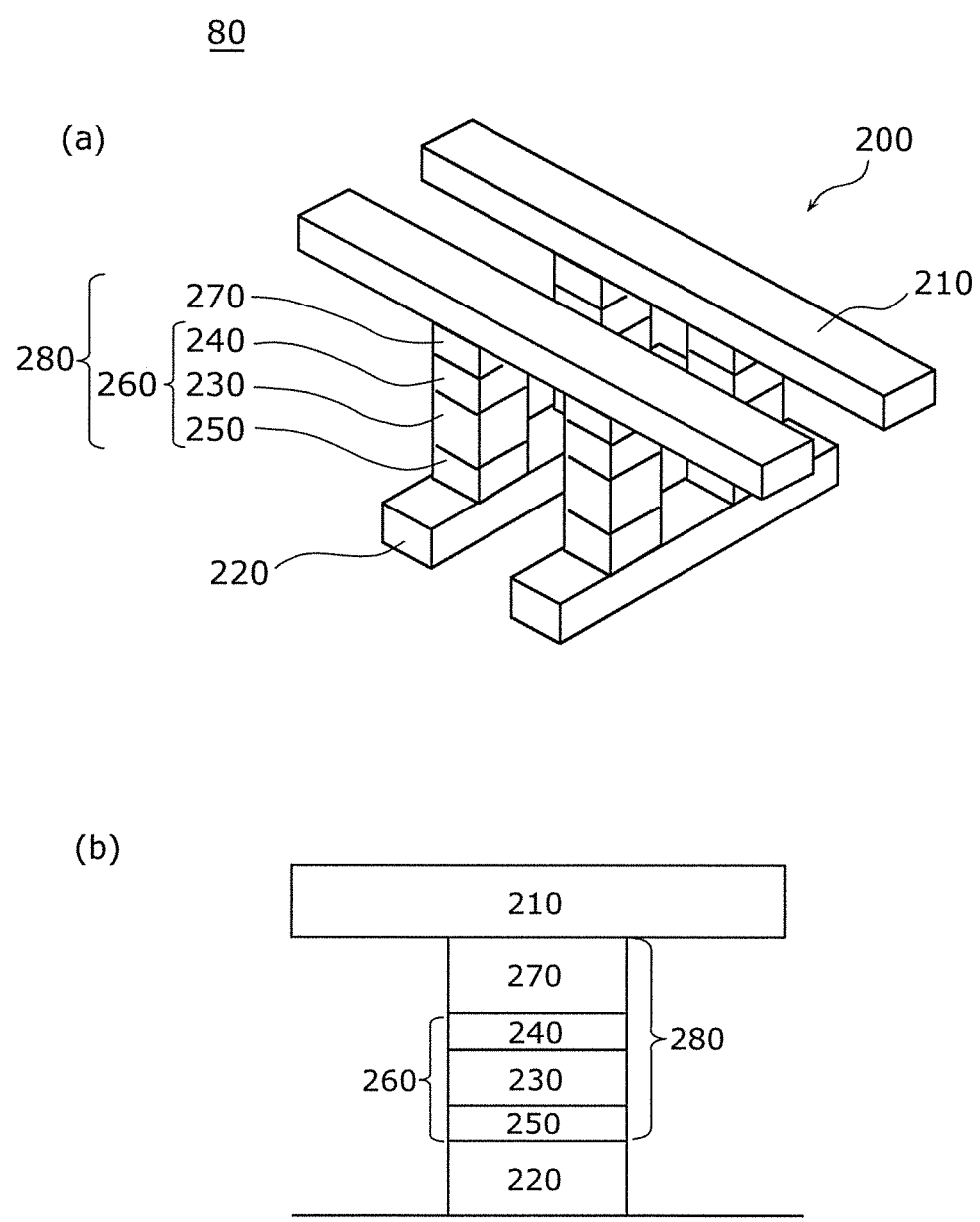
[FIG. 23] Parts (a) and (b) of FIG. 23 are cross-sectional views of a conventional common non-volatile storage device.

Part (a) of FIG. 21 and (a) of FIG. 22 are cross-sectional views of a hole-type variable resistance element produced in the second experiment, and (b) of FIG. 21 and (b) of FIG. 22 are graphs illustrating resistance change of the variable resistance element due to electrical pulses. As illustrated in (a) of FIG. 21 and (a) of FIG. 22, a $Ta_2O_5$ layer which is the first variable resistance layer 105a having a high oxygen content, and a $TaO_x$ layer which is the second variable resistance layer 105b having an oxygen content lower than that of the first variable resistance layer comprising $Ta_2O_5$ are formed in this stated order on a platinum (Pt) layer which is the first electrode 102 in a hole, and a tantalum nitride (TaN) layer is further formed thereon as the second electrode 110.

The difference between (a) of FIG. 21 and (a) of FIG. 22 is the radius of the holes, and the hole in (a) of FIG. 21 has a radius of 260 nmφ, whereas the hole in (a) of FIG. 22 has a radius of 500 nm cp. Part (b) of FIG. 21 and (b) of FIG. 22 show results of the measurement of resistance obtained when electric pulses having a pulse width of 100 ns and voltages of +1.5V and −2.0V relative to the first electrode are alternately applied between the first electrode 102 and the second electrode 110, or specially, to the second electrode. It can be seen that in the case of (b) of FIG. 21, the resistance value is about 20000Ω by the application of an electrical pulse having a voltage of +1.5V, and is about 100000Ω if an electrical pulse having a voltage of −2.0V is applied, which shows a resistance change by about one order of magnitude. Also, it can be seen that in the case of (b) of FIG. 22 as well, the resistance value is about 2500Ω by the application of an electrical pulse having a voltage of +1.5V, and is about 30000Ω if an electrical pulse having a voltage of −2.0V is applied, which shows a resistance change by about one order of magnitude.

It could be confirmed, according to the results of the above experiments, that a variable resistance element comprising a tantalum oxide used as the variable resistance layer 105, as an example, exhibits favorable resistance change characteristics. Further, it was confirmed that the non-volatile storage device exhibiting favorable resistance change characteristics can be obtained by adopting, for example, the configuration of the variable resistance element used in the experiments for the variable resistance element of the non-volatile storage device according to the embodiments.

Industrial Applicability

The present invention provides the variable resistance semiconductor storage device and the method for manufacturing the same, and achieves highly reliable non-volatile memories which perform stable operation, and thus is useful in various electronic device fields in which non-volatile memories are used.

REFERENCE SIGNS LIST

10 Non-volatile storage device according to Embodiment 1 of present invention
20 Non-volatile storage device according to modification of Embodiment 1 of present invention
30 Non-volatile storage device according to Embodiment 2 of present invention
40 Non-volatile storage device according to Embodiment 3 of present invention
50 Non-volatile storage device according to Embodiment 4 of present invention
60 Non-volatile storage device according to in Embodiment 5 of present invention
70 Non-volatile storage device according to Embodiment 6 of present invention
80 Non-volatile storage device which includes conventional variable resistance element
100 Substrate
101 First line
101a Main layer of first line
101a' Plated layer
101b, 101b' Barrier metal layer of first line
101z Line trench for forming first line 101A First area (area near which memory cell holes of first lines are present)
101B Second area (area other than first area of first lines)
102 First electrode
102a Upper layer of first electrode (precious metal layer)
102b Lower layer of first electrode (adhesion layer)
103a First interlayer insulating layer
103b Second interlayer insulating layer
103c Third interlayer insulating layer
104 Memory cell hole
105 Variable resistance layer
105a First variable resistance layer
105b Second variable resistance layer
106 Second line
106a Main layer of second line
106b Barrier metal layer of second line (electrode of diode)
106c Semiconductor layer of second line
107 Contact hole
108 Electric conduction plug
109 Extraction line
109a Main layer of extraction line
109b Barrier metal layer of extraction line
109c Semiconductor layer of extraction line
110 Second electrode
110' Depressed portion in second interlayer insulating layer
111 Semiconductor layer
112 Barrier metal layer
113 Plated layer
121 First memory cell layer
122 Second memory cell layer
123 Third memory cell layer
124 Fourth memory cell layer
200 Crosspoint memory cell array
210 Upper line (bit line)
220 Lower line (word line)
230 Variable resistance layer
240 Upper electrode
250 Lower electrode
260 Variable resistance element
270 Nonlinear element (varistor)
280 Memory cell

The invention claimed is:

1. A variable resistance non-volatile storage device comprising:
a substrate;
a first interlayer insulating layer formed on the substrate;
a first line which is formed in a line trench in the first interlayer insulating layer, and includes a barrier metal layer and a main layer, the barrier metal layer covering bottom and side surfaces of the line trench, and the main layer comprising a metal and filling an inside of the line trench;
a first electrode comprising a precious metal, formed and covering at least the main layer and the barrier metal layer at a top surface of the first line;
a second interlayer insulating layer formed above the substrate, on and above the first line, and on the first electrode;
memory cell holes formed in the second interlayer insulating layer on the first electrode;
a variable resistance layer formed in the memory cell holes and connected to the first electrode; and
second lines each covering the variable resistance layer and one of the memory cell holes, and formed on the second interlayer insulating layer,
wherein the first line includes, along a length of the first line, a portion in a first area which is an enclosed area along connected outer edges of the memory cell holes, and a portion in a second area other than the first area,
the first electrode is formed across the memory cell holes,
in an arbitrary widthwise cross section of the first line in the first area, the first electrode is in contact with the barrier metal layer of the first line, and the barrier metal layer and the first electrode cover the main layer of the first line, and
the first line in the first area is not in direct contact with the second interlayer insulating layer.

2. The variable resistance non-volatile storage device according to claim 1,
wherein the variable resistance layer includes:
a first variable resistance layer formed at least on a bottom of each of the memory cell holes, connected to the first electrode, and comprising a first transition metal oxide which has a first oxygen deficiency; and
a second variable resistance layer formed in the memory cell holes and on the first variable resistance layer, and comprising a second transition metal oxide which is obtained from the same transition metal as a transition metal of the first variable resistance layer and has an oxygen deficiency higher than the first oxygen deficiency of the first variable resistance layer.

3. The variable resistance non-volatile storage device according to claim 1,
wherein the first electrode comprises a material having a standard electrode potential higher than a standard electrode potential of a transition metal which the variable resistance layer comprise.

4. The variable resistance non-volatile storage device according to claim 1,
wherein the first electrode includes an adhesion layer as a lower layer thereof.

5. The variable resistance non-volatile storage device according to claim 1, further comprising:
second electrodes provided on the variable resistance layer in the memory cell holes, and in contact with the variable resistance layer and the second lines.

6. The variable resistance non-volatile storage device according to claim 2, comprising
a diode element provided between the second variable resistance layer and each of the second lines, and having a rectification effect.

7. A method for manufacturing a variable resistance non-volatile storage device, the method comprising:
forming a line trench in a first interlayer insulating layer on a substrate;
forming a barrier metal layer which covers bottom and side surfaces of the line trench and the first interlayer insulating layer;
forming a main layer which is in contact with the barrier metal layer, comprises a metal, and fills an inside of the line trench;
removing the barrier metal layer and the main layer on the first interlayer insulating layer, and forming, in the line trench, a first line which includes the barrier metal layer and the main layer;
forming a first electrode which comprises a precious metal and at least covers the main layer and the barrier metal layer at a top surface of the first line;
forming a second interlayer insulating layer on the first interlayer insulating layer, on and above the first line, and on the first electrode;
forming memory cell holes in the second interlayer insulating layer on the first electrode;

forming, at least on a bottom of each of the memory cell holes, a first variable resistance layer comprising a transition metal oxide and connected to the first electrode;

forming, in each of the memory cell holes and on the first variable resistance layer, a second variable resistance layer which comprises a transition metal oxide obtained from the same transition metal as a transition metal of the first variable resistance layer, and has an oxygen content lower than an oxygen content of the first variable resistance layer; and forming, on the second interlayer insulating layer, second lines each covering the second variable resistance layer and one of the memory cell holes, wherein when the first line includes, along a length of the first line, a portion in a first area which is an enclosed area along connected outer edges of the memory cell holes, and a portion in a second area other than the first area, in the formation of the first electrode, the first electrode is formed at least in the first area, the first electrode covering the barrier metal layer and the main layer.

8. A method for manufacturing a variable resistance non-volatile storage device, the method comprising:

forming a line trench in a first interlayer insulating layer on a substrate;

forming a barrier metal layer which covers bottom and side surfaces of the line trench and the first interlayer insulating layer;

forming a main layer which is in contact with the barrier metal layer, comprises a metal, and fills an inside of the line trench;

removing the main layer on the first interlayer insulating layer, and forming, in the line trench, a first line which includes the barrier metal layer and the main layer while the barrier metal layer is left on a surface of the first interlayer insulating layer;

removing, after forming a first electrode which comprises a precious metal and at least covers the main layer and the barrier metal layer at a top surface of the first line, an area which is included in the barrier metal layer on the surface of the first interlayer insulating layer and not covered with the first electrode;

forming a second interlayer insulating layer on the first interlayer insulating layer, on and above the first line, and on the first electrode;

forming memory cell holes in the second interlayer insulating layer on the first electrode;

forming, at least on a bottom of each of the memory cell holes, a first variable resistance layer comprising a transition metal oxide and connected to the first electrode;

forming, in each of the memory cell holes and on the first variable resistance layer, a second variable resistance layer which comprises a transition metal oxide obtained from the same transition metal as a transition metal of the first variable resistance layer, and has an oxygen content lower than an oxygen content of the first variable resistance layer; and forming, on the second interlayer insulating layer, second lines each covering the second variable resistance layer and one of the memory cell holes, wherein when the first line includes, along a length of the first line, a portion in a first area which is an enclosed area along connected outer edges of the memory cell holes, and a portion in a second area other than the first area, in the formation of the first electrode, the first electrode is formed at least in the first area, the first electrode covering the barrier metal layer and the main layer.

9. The variable resistance non-volatile storage device according to claim 1, comprising:

an extraction contact on the first line in the second area, wherein an extraction line is formed connected to the extraction contact.

* * * * *